(12) United States Patent
Umekawa et al.

(10) Patent No.: US 9,177,819 B2
(45) Date of Patent: Nov. 3, 2015

(54) METHOD FOR MANUFACTURING SILICON SUBSTRATE HAVING TEXTURED STRUCTURE

(71) Applicant: TOKUYAMA CORPORATION, Yamaguchi (JP)

(72) Inventors: Hideki Umekawa, Tsukuba (JP); Shinji Matsui, Himeji (JP); Shinya Omoto, Settsu (JP)

(73) Assignee: Tokuyama Corporation, Yamaguchi (JP)

( * ) Notice: Subject to any disclaimer, the term of this patent is extended or adjusted under 35 U.S.C. 154(b) by 0 days.

(21) Appl. No.: 14/363,967

(22) PCT Filed: Dec. 6, 2012

(86) PCT No.: PCT/JP2012/081633
§ 371 (c)(1),
(2) Date: Jun. 9, 2014

(87) PCT Pub. No.: WO2013/084986
PCT Pub. Date: Jun. 13, 2013

(65) Prior Publication Data
US 2014/0349485 A1    Nov. 27, 2014

(30) Foreign Application Priority Data

Dec. 9, 2011  (JP) ................................ 2011-270608
Dec. 5, 2012  (JP) ................................ 2012-266499

(51) Int. Cl.
*H01L 21/302* (2006.01)
*H01L 21/308* (2006.01)
(Continued)

(52) U.S. Cl.
CPC ............ *H01L 21/3081* (2013.01); *B82Y 10/00* (2013.01); *B82Y 40/00* (2013.01);
(Continued)

(58) Field of Classification Search
USPC ........ 438/689–694, 71, 48, 57; 428/209, 210, 428/385, 387, 391, 758, 778
See application file for complete search history.

(56) References Cited

U.S. PATENT DOCUMENTS 7,883,764 B2 * 2/2011 Murao ........................... 428/209
8,444,899 B2 * 5/2013 Desimone et al. ............ 264/226
(Continued)

FOREIGN PATENT DOCUMENTS

JP         01111887       4/1989
JP        2006073832      3/2006
(Continued)

OTHER PUBLICATIONS

J. Zhao, A. Wang and M.A. Green, Prog. Photovoit, Res. Appl. 7, 471 (1999).
Proceedings of the 58th Spring Meeting, 2011, The Japan Society of Applied Physics and the Related Societies, 24a-KE-7.

*Primary Examiner* — Nadine Norton
*Assistant Examiner* — Maki Angadi
(74) *Attorney, Agent, or Firm* — Malloy & Malloy, P.L.

(57) ABSTRACT

The present invention provides a method for manufacturing a silicon substrate having texture structure, by which, in comparison with conventional methods, it is possible to reduce manufacturing step and form easily regular texture structure on silicon substrate surface. The method of the present invention comprises the steps of: (A) forming a pattern on the silicon substrate using a resin-comprising composition; (B) irradiating an etching gas to the silicon substrate surface other than the pattern portion; and (C) processing the silicon substrate irradiated with the etching gas with an alkaline etching fluid to form concave structure under the pattern portion. Furthermore, the present invention provides a resin-comprising composition usable in the method, in particular, a composition comprising photo-curable resin.

12 Claims, 12 Drawing Sheets

(51) Int. Cl.
*G03F 7/00* (2006.01)
*H01L 31/0236* (2006.01)
*G03F 7/004* (2006.01)
*G03F 7/027* (2006.01)
*G03F 7/075* (2006.01)
*B82Y 10/00* (2011.01)
*B82Y 40/00* (2011.01)

(52) U.S. Cl.
CPC ........... *G03F 7/0002* (2013.01); *G03F 7/0047* (2013.01); *G03F 7/027* (2013.01); *G03F 7/0757* (2013.01); *H01L 21/3085* (2013.01); *H01L 31/02363* (2013.01); *Y02E 10/50* (2013.01)

(56) References Cited

U.S. PATENT DOCUMENTS

| | | | | |
|---|---|---|---|---|
| 8,652,869 | B2* | 2/2014 | Nishimura et al. | 438/71 |
| 2005/0221222 | A1* | 10/2005 | Ito et al. | 430/270.1 |
| 2011/0183127 | A1* | 7/2011 | Kodama | 428/195.1 |

FOREIGN PATENT DOCUMENTS

| | | |
|---|---|---|
| JP | 2007072374 | 3/2007 |
| JP | 2010251434 | 4/2010 |
| WO | WO 2010/090142 | 8/2010 |
| WO | WO 2010/109692 | 9/2010 |
| WO | WO 2011/132340 | 10/2011 |

* cited by examiner

METHOD FOR MANUFACTURING SILICON SUBSTRATE HAVING TEXTURED STRUCTURE

TECHNICAL FIELD

The present invention relates to a method for manufacturing a silicon substrate having texture structure in which concave structure is formed selectively under patter portion (in this specification, the term "texture structure" means a "structure having fine concavo-convex shape"). The present invention relates also to a composition comprising resin (hereinafter, it may be referred to as "resin-comprising composition"), which is usable in the above-described method, especially a composition comprising photo-curable resin. According to the present invention, it is possible to form easily a texture structure (inverted pyramid structure) which is suitable for silicon wafer of substrate for solar cell or LED, for example, prism structure, or optional concavo-convex structure which is derived from a pattern. The silicon substrate manufactured by the method, in which the concave portion is formed selectively on portions of the substrate corresponding to the pattern portion, can be used as a mold for nanoimprint.

The forming of texture structure on the silicon substrate is used for any usages such as forming of texture structure on silicon substrate for solar cell, forming of prism structure, fine concavo-convex structure for antireflection, improvement of luminous efficacy and light extraction efficiency as LED substrate, forming of fine concavo-convex structure of GaN growth, forming barrier rib structure shaped like a lattice for cell culture, etc., besides forming of circuit for semiconductor.

Hitherto, in order to form the texture structure having regularly-arranged structure, when the texture structure is formed on surface of silicon substrate, a fine processing technology such as electron beam lithography, photolithography using mask, dry-etching, ion beam, etc. has generally been used. As a resist mask, various masks formed directly by screen printing, ink jet printing, imprint, etc. may be used, as well as a clear substrate such as quartz, etc. on which a pattern that forms mask is formed with metal, etc.

Also, though the formed structure is irregular, a technique of forming concavo-convex structure by etching directly the silicon substrate surface with an etching liquid has generally been used because of low cost. For example, as a general method for forming fine concavo-convex structure on silicon substrate for solar cell, the etching treatment using an acid etching liquid or an alkaline etching liquid has been used.

For the purpose of improving power generation efficiency of solar cell, it is an effective means for absorbing efficiently incident light from surface into the substrate to form a regular texture structure on the silicon substrate surface. Since the etching process using a conventional acid etching liquid or alkaline etching liquid utilizes a difference of etching rate in (100) plane, (110) plane, (111) plane of crystal plane orientation of silicon and establishes an anisotropic etching, the resulting texture structure is irregular in size and arrangement. In general, the concave and convex arrange randomly in a size of about 1-10 µm. Accordingly, the texture structure has a defect that the concave and convex are not even. In case of the etching with the acid etching liquid or the alkaline etching liquid, there is a limit in improvement of power generation efficiency, because it is impossible to form the texture structure in which the concavo-convex structure arranges finely and regularly with the size of less than few µm (micrometer).

Dr. Martin A. Green, et. al., University of New South Wels, Sydney, Australia, have reported that a solar cell on which a regular inverted pyramid structure having side length of about few µm is formed demonstrates 24.7% energy conversion efficiency and can provide the maximum efficiency (Non Patent Literature 1). The inverted pyramid structure is formed by photolithography which is used in the preparation of semiconductor circuit element.

In case of forming regular texture structure on silicon substrate surface, among the above-described technologies, imprinting technology is especially focused, because it has a possibility to enlarge area and to form easily and costly a pattern having size of few nm (nanometer) to few hundred µm.

The imprinting technology is a technology for transcribing a desirable pattern to a substrate surface by pressing a mold having concavity and convexity of pattern which corresponds to a desirable pattern against a coating film formed on the substrate surface. Among the imprinting technology, the technology for forming an ultrafine pattern having size of few nm to few µm is especially referred to as nanoimprint (hereinafter, the term, "imprint", used in the specification means both of imprint and nanoimprint.

As a method for forming a texture structure on silicon substrate by imprint, there has been described in, for example, Patent Literature 1, the method by which the texture structure having large size is formed by transcribing dents and dings to a base layer on the light-transmitting insulating substrate by nanoimprint. Also, there is described in Non Patent Literature 2 the method for forming an antireflection structure on silicon substrate surface by nanoimprint using porous alumina.

However, the study of inventors reveals that there is room for improvement on the above-described methods for forming texture structure on silicon substrate by imprint in the following points.

In the method described in Patent Literature 1, the silicon wafer having the texture structure that is formed on silicon substrate surface by a conventional etching with an acid or alkali is used as a mold. As a result, since the texture structure obtained by the method described in the Patent Literature 1 corresponds to the texture structure of the used mold, it is substantially same as the conventional texture structure formed by the technique of forming texture structure on silicon substrate surface by the etching liquid treatment, and consequently the formed texture structure is uneven in size and arrangement. When the silicon substrate having the formed texture structure is used as a substrate for solar cell, there is a limit in absorbing efficiently incident light from surface.

The fabrication of the antireflection structure on surface of silicon substrate by imprint using porous alumina, which is described in Non Patent Literature 2, is carried out as follows: A silicon substrate having surface oxide film ($SiO_2$) is used. A resist pattern in the form of hale array is formed by applying PAK-01 (TOYO GOSEI INDUSTRIES CO.) on the silicon substrate and irradiating with ultraviolet ray through a transparent mold. The remaining film of resist and the oxide film at the opening portion of the resist are removed by argon ion milling. A chemical etching is carried out in hydrazine solution to form array structure of inverted pyramid shape. In this case, the surface portion of silicon substrate corresponding to the opening portion of resist is subjected to an etching process by the chemical etching with hydrazine solution and thus the concave structure is formed. In this method, after forming the texture structure by the chemical etching using the resist pattern as mask, it is required to remove again the residue of resist pattern used as mask and the surface oxide film by the etching process and there is room in improvement in the point of need of multistep.

CITATION LIST

Patent Literature

PTL 1: WO2010/090142

Non Patent Literature

NPL 1: J. Zhao, A. Wang and M. A. Green, Prog. Photovolt.: Res. Appl. 7, 471 (1999)
NPL 2: Proceedings of the 58th Spring Meeting, 2011; The Japan Society of Applied Physics and the Related Societies, 24a-KE-7

SUMMARY OF INVENTION

Technical Problem

An object of the present invention is to provide a method for manufacturing a silicon substrate having textured structure, by which, in comparison with conventional methods, it is possible to reduce manufacturing step and form easily a regular textured structure on silicon substrate surface. A further object of the present invention is to provide a resin-comprising composition usable in the above-described method for manufacturing a silicon substrate having texture structure, in particular, a composition comprising a photocurable resin (hereinafter, it may be referred to a "photocurable resin-comprising composition").

Solution to Problem

The inventors have earnestly studied in order to solve the above-described problems. As a result, they found surprisingly that a concave structure is formed on silicon substrate surface under a formed pattern portion, while, in the conventional method, a formed resist pattern is used as a mask and a concave structure is formed by digging on silicon substrate surface corresponding to opening portion of the resist pattern, and a such effect that a regular texture structure corresponding to the formed pattern can easily be formed is provided, whereby they completed the present invention.

The present invention relates to a method for manufacturing a silicon substrate having regular texture structure, said method comprising steps of:

(A) forming a pattern with a resin-comprising composition on the silicon substrate, (B) irradiating an etching gas to the silicon substrate surface other than the pattern portion, and (C) processing the silicon substrate irradiated with the etching gas with an alkaline etching liquid to form concave structure under the pattern portion.

Advantageous Effects of Invention

In the method for manufacturing according to the present invention, the concave structure is formed on the silicon substrate surface under the pattern portion and the regular texture structure corresponding to the pattern can easily be formed. The term "pattern portion" used in the present invention means a convex portion that is formed by depositing a resin on the silicon substrate. Specifically, when the resin is printed in the shape of line on silicon substrate, the line is just the "pattern portion". In the so-called imprinting technology in which concavo-convex structure is formed by applying a resin on a silicon substrate and pressing a mold against the formed resin layer, the convex portion of the concavo-convex structure of resin on the silicon substrate is the "pattern portion". The expression "concave structure is formed under pattern portion" used in the present invention means that the concave structure is formed substantially over the whole silicon substrate below the respective pattern portions.

When a pattern of lattice shape or reciprocal lattice shape is formed on a silicon substrate using a composition comprising resin (hereinafter, it may be referred to as "resin-comprising composition") by, for example, imprint, a concave structure can easily be formed by irradiating an etching gas to the silicon substrate surface other than the pattern portion to remove thin residue portion of coating film other than the pattern portion (refer to as "remaining film") and by processing then the silicon substrate irradiated with the etching gas with an alkaline etching liquid to etch the silicon substrate surface under the pattern portion of lattice or reciprocal lattice shape. When a pattern of line and space shape is formed on a silicon substrate using a resin-comprising composition, a prism structure can easily be formed by operating similarly.

According to the method of the present invention, it is not necessary to use silicon substrate having surface oxide film, which is generally used as silicon substrate in manufacture of semiconductor circuit, as shown in the NPL 2 and a silicon substrate which is not subjected to a process of forming surface oxide film can be used just as it is. In the method described in NPL 2, the concave structure is formed on a zone other than the resist pattern formed on the silicon substrate ("resist pattern" corresponding to the "pattern portion" in the present invention) ("zone other than resist pattern" is referred to as "opening portion of resist pattern") and accordingly the resist layer which forms the pattern remains on silicon substrate while keeping adhesion to the silicon substrate through the surface oxide film ($SiO_2$ film). Therefore, a complicated process for removing again the resist layer and $SiO_2$ film by the irradiating the etching gas after forming the concave structure is required. In contrast, according to the method of the present invention, after forming the concave structure by the irradiation of etching gas and then the process with the alkaline etching liquid, the resist layer which forms the pattern portion is present on the silicon substrate as residue under the condition that the adhesion to silicon substrate is broken. For this reason, the residue can easily be removed by a rinsing treatment with an alkaline solution without carrying out again the irradiation of etching gas as the conventional method.

Thus, the method for manufacturing silicon substrate having texture structure according to the present invention has the following advantages: A silicon substrate which is not subjected to the process for forming surface oxide film can be used just as it is. The pattern residue after processing with alkaline etching solution can easily be removed by the rinsing treatment with alkaline solution, while holding the formed texture structure. The silicon substrate having fine and regular texture structure can be manufactured with high productivity.

In the present invention, even if a pattern is formed on a silicon substrate by various processes, it is possible to manufacture easily the silicon substrate having texture structure corresponding to shape and configuration of the pattern.

Also, since the concave structure is formed under the pattern portion, the surface area of convex portion of pattern in a mold to be used becomes smaller compared to the method described in NPL 2. Accordingly, the step of pressing the mold against the coating film made of resin-comprising composition can be carried out with a low pressure and consequently it is possible to mold the pattern having thin remaining film, besides the transcription accuracy of pattern is excellent.

The silicon substrate which is manufactured by the above-described method for manufacturing silicon substrate having texture structure according to the present invention can be used as a silicon substrate for solar cell or LED, or a mold for

DESCRIPTION OF EMBODIMENTS

The method for manufacturing a silicon substrate having texture structure according to the present invention comprises the step (A) of forming a pattern with a resin-comprising composition on the silicon substrate, the step (B) of irradiating an etching gas to the silicon substrate surface other than the pattern portion, and the step (C) of processing the silicon substrate irradiated with the etching gas with an alkaline etching liquid to form concave structure under the pattern portion.

Figure 1:
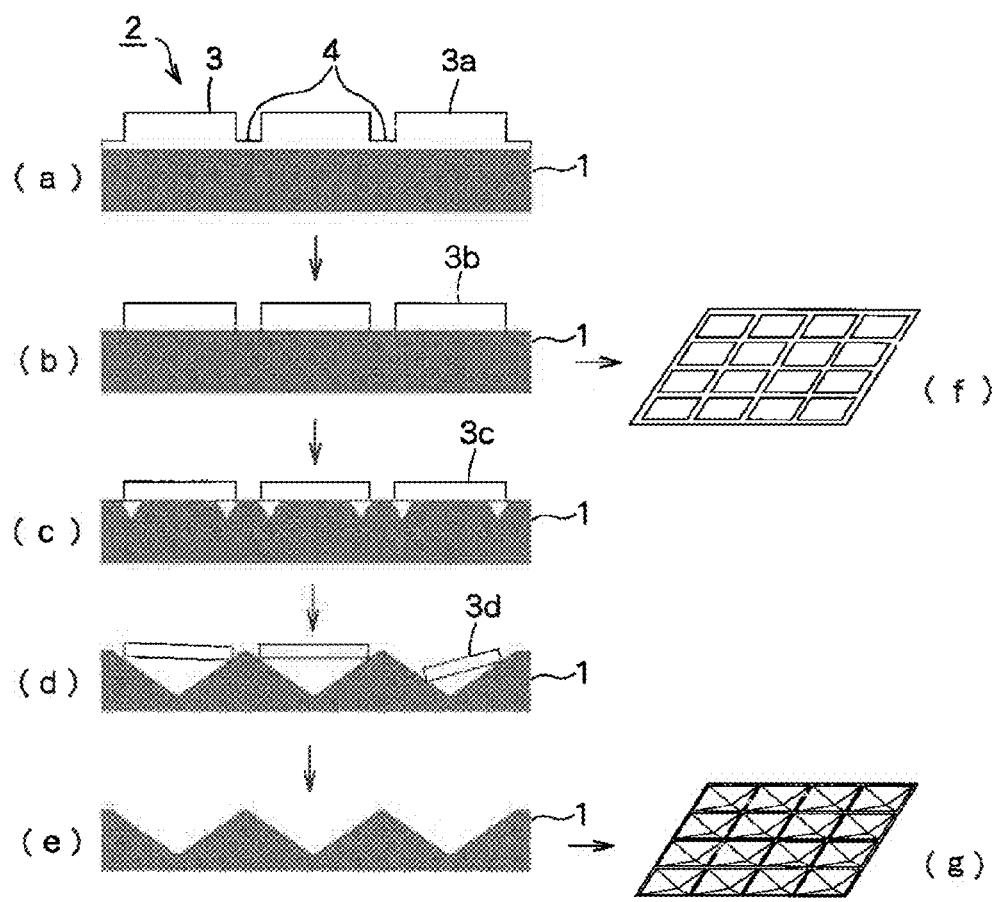
FIG. 1 is a scheme showing the manufacturing process of the silicon substrate having texture structure according to the method of the present invention.

Referring to the FIG. 1, the procedure for forming the texture structure on silicon substrate according to the method of the present invention will be briefly explained.

In the step (A), a silicon substrate 1 which is not subjected to a process for forming $SiO_2$ film (oxide film) is used. On this silicon substrate, a pattern 2 made of a resin-comprising composition is formed. When, for example, nanoimprint is used, the pattern 2 is formed by applying the resin-comprising composition (i.e. ink) on the silicon substrate, transcribing the pattern to the formed ink coating film using a lattice mold (convex line), and curing the ink by various curing method such as ultraviolet irradiation, etc. The formed pattern 2 is constituted by pattern portion 3 and remaining film 4 (see FIG. 1(a)).

In the step (B), the etching gas is irradiated to the pattern 2 constituted by the pattern portion 3 and the remaining film 4 formed on the silicon substrate. Whereby, the remaining film 4 of pattern is removed and the silicon substrate is exposed. As a result, the surface of silicon substrate other than the patter portion 3 is irradiated with the etching gas. On this occasion, the pattern portion 3 is slightly subjected to removal action and its thickness is reduced (see FIG. 1 (b)). FIG. 1 (f) is a sectional view showing summary of morphology of pattern on the silicon substrate after irradiation of etching gas.

Though it is a merit of the present invention that a substrate which is not subjected to a step of forming an oxide film can be used just as it is, the fact does not mean that use of a substrate which is subjected to step of forming an oxide film is denied.

Subsequently, in the step (C), the gas-etched silicon substrate is subjected to a wet treatment with an alkaline etching liquid to form the concave structure under the pattern portion 3c (see FIGS. 1 (c) and (d)). Thereafter, a rinsing treatment with alkali solution is conducted to remove the residue of pattern portion 3d (see FIG. 1 (e)). FIG. 1 (g) is a perspective view showing roughly morphology of the texture structure formed on silicon substrate.

Now, the respective steps (A) to (C) which constitute the method for manufacturing silicon substrate having texture structure according to the present invention will be explained in detail.

Step (A) of Forming a Pattern with a Resin-Comprising Composition on Silicon Substrate As a method for forming a patter, a well-known method can be used without any limitation. However, considering the formation of fine pattern having the size of about few μm, the method for forming the pattern by imprint is preferably used.

On the imprint, a process for forming pattern is classified roughly into two types depending on type of material used in formation of coating film on substrate surface. One type is a process for transcribing pattern to coating film, which comprises steps of heating the coating film formed on substrate surface to plasticize, of pressing a mold against the coating film, and of cooling the coating film to solidify. Another type is a process in which at least one of used mold and substrate is made of light-permeable material and a pattern is transcribed by steps of applying a photo-curable composition in the form of liquid to a substrate to form a coating film, of pressing the mold against the coating film, and of irradiating the coating film with light through the mold or the substrate to cure the coating film. Among them, the photo-imprinting process in which the patter is transcribed through light-irradiation has been widely used as the imprint, because it is possible to form a high-precision pattern.

The imprint means a process by which a fine pattern having the size of 5 nm to 500 nm can suitably be formed well as well as a pattern having the size of 5 nm to 100 μm. However, it should be appreciated that the imprint may be used for forming a pattern having the size of exceeding 100 μm.

The step for forming pattern with resin-comprising composition on silicon substrate by the imprint will be explained.

The coating film is formed by applying a resin-comprising composition on a silicon substrate by a known method. As the method for applying, a known method such as spin coating, dipping, dispensing, ink-jet, roll-to-roll, gravure printing, die-coating, bar-coating, curtain-coating, etc. can be used. There is no particular limitation on thickness of coating film. The thickness can suitably be determined according to a use, but it is usually in the range of 0.01 μm to 100 μm.

In order to form a thin coating film, it is possible to dilute the resin-comprising composition with organic solvent. In that case, a drying step may suitably be incorporated in accordance with boiling point, volatility of the used organic solvent.

Then, a pattern-forming surface of mold, on which a desirable pattern is previously formed, is brought into contact with the formed coating film. The mold is preferably made of transparent material such as quartz, resin film, polydimethylsiloxane, polyvinyl alcohol, etc. in order to cure the applied composition via photoirradiation. Among them, the mold made of resin film, polydimethylsiloxane, polyvinyl alcohol, etc. can be preferably used, because it has good flexibility and provides good following property even in case of using a silicon substrate having poor surface roughness. Especially, the mold made of polydimethylsilozane which has good release property is preferably used, because, when the mold is released from the cured coating film the mold, it can be released with a low stress without injuring adhesion between the silicon substrate and the cured coating film. In case of using the mold made of polydimethylsiloxane, the resin-comprising composition may be used in imprint as it contains the organic solvent, or it may be dried after releasing.

There is no particular limitation on the pressure, but the transcription of pattern can be conducted with a pressure of 0.01-1 MPa. Of course, it is possible to transcribe pattern with a pressure beyond upper limit of the pressure range.

Thereafter, a light is irradiated to cure the coating film, while remaining the contact between the pattern-forming surface of mold and the coating film. The light to be irradiated has the wave-length of up to 600 nm and the irradiation time is selected within a range of 0.1-300 seconds. It is usually in the range of 1-60 seconds but it may vary depending to the thickness of coating film.

In relation to atmosphere in which the photopolymerization is carried out, the photopolymerization may be conducted in the atmosphere, but it is preferable to conduct the photopolymerization in an atmosphere in which inhibition due to oxygen is low, such as nitrogen gas atmosphere, inert gas atmosphere, fluorine gas atmosphere, vacuum atmosphere, etc.

After the photopolymerization, a pattern formed by the cured coating film (cured film) is obtained on the substrate by detaching the mold from the cured film.

The silicon substrate usable in the present invention may be either single crystalline silicon or polycrystalline silicon. However, considering the formation of texture structure by the etching with alkali described below, the single crystalline silicon is preferably used because of ease of preparation.

In the method for manufacturing silicon substrate having texture structure according to the present invention, the adhesion between the silicon substrate and the resin-comprising composition is important. However, there is no particular limitation on the resin-comprising composition as long as it has good adhesion to the silicon substrate and an ability to form a pattern, and accordingly the composition can comprise any resin. As the resin, for example, thermoplastic resin, thermosetting resin, photo-curable resin may be used. Among them, considering ease of pattern formation, preparation, and productivity, etc., it is desirable that the resin is a photo-curable resin. There is no particular limitation on the resin-comprising composition as long as it can adhere tightly to the silicon substrate, but it is preferable to use a composition comprising photo-curable resin, because it has good adhesion to silicon substrate and consequently the pattern formation by a process with an alkaline etching liquid can easily be carried out in a short time.

Now, the photo-curable resin of the present invention will be explained. The photo-curable resin comprises generally polymerizable monomer and photoinitiator. In the present invention, any known photo-curable resin can be used without any limitation. However, considering a case of carrying out the formation of fine pattern having the size of up to 1000 nm with a low pressure, it is advantageous that viscosity of composition for pattern formation is low and accordingly it is preferable to use a photo-curable resin comprising a polymerizable monomer having (meth)acrylic group (hereinafter, it may be referred to as "(meth)acrylic group-having polymerizable monomer").

(a) Polymerizable Monomer Having (Meth)Acrylic Group

In the present invention, there is no particular limitation on the polymerizable monomer having (meth)acrylic group and the known polymerizable monomers which are usable in photopolymerization can be used. However, it should be appreciated that alkoxysilane containing (meth)acrylic group is not included into the polymerizable monomer having (meth)acrylic group. As preferable compound, there can be exemplified polymerizable monomer that contains (meth) acrylic group but no silicon atom in molecule. The polymerizable monomer may be monofunctional polymerizable monomer having one (meth)acrylic group in one molecule or polyfunctional polymerizable monomer having two or more (meth)acrylic groups in one molecule. Also, the monofunctional polymerizable monomer and the polyfunctional polymerizable monomer may be used in combination. It is preferable to use a (meth)acrylic group-having polymerizable monomer that contains also vinyl ether group, because it can be polymerized by thermal polymerization as well as by photopolymerization and accordingly the effect of invention is increased.

As an example of the (meth)acrylic group-having polymerizable monomer, there can be exemplified as the monofunctional polymerizable monomer that has one (meth)acrylic group in one molecule, for example, methyl (meth)acrylate, ethyl (meth)acrylate, propyl (meth)acrylate, n-butyl (meth)acrylate, isobutyl (meth)acrylate, tert-butyl (meth)acrylate, 2-ethylhexyl (meth)acrylate, isodecyl (meth)acrylate, isoamyl (meth)acrylate, isomyristyl (meth)acrylate, n-lauryl (meth)acrylate, n-stearyl (meth)acrylate, isostearyl (meth)acrylate, long-chain alkyl (meth)acrylate, n-butoxyethyl (meth)acrylate, butoxyethylene glycol (meth)acrylate, cyclohexyl (meth)acrylate, tetrahydrofurfuryl (meth)acrylate, butoxyethyl (meth)acrylate, 2-ethylhexyl-diglycol (meth)acrylate, dicyclopentenyl (meth)acrylate, dicyclopentenyloxyethyl (meth)acrylate, dicyclopentanyl (meth)acrylate, benzyl (meth)acrylate, 2-hydroxyethyl (meth)acrylate, 2-hydroxypropyl (meth)acrylate, 2-hydroxybutyl (meth)acrylate, hydroxyethyl (meth)acrylate, glycidyl (meth)acrylate, methoxyethylene glycol modified (meth)acrylate, ethoxyethylene glycol modified (meth)acrylate, propoxyethylene glycol modified (meth)acrylate, methoxypropylene glycol modified (meth)acrylate, ethoxypropylene glycol modified (meth)acrylate, propoxypropylene glycol modified (meth)acrylate, isobornyl (meth)acrylate, adamantane (meth)acrylate, acryloyl morpholine, etc.; and (meth)acrylates having aromatic ring such as phenoxymethyl (meth)acrylate, phenoxyethyl (meth)acrylate, phenoxyethylene glycol modified (meth)acrylate, phenoxypropylene glycol modified (meth)acrylate, hydroxyphenoxyethyl (meth)acrylate, 2-hydroxy-3-phenoxypropyl (meth)acrylate, hydroxyphenoxyethylene glycol modified (meth)acrylate, hydroxyphenoxypropylene glycol modified (meth)acrylate, alkylphenolethylene glycol modified (meth)acrylate, alkylphenolpropylene glycol modified (meth)acrylate, hydroxyethylated o-phenylphenol (meth)acrylate, ethoxylated o-phenylphenol (meth)acrylate, isobonyl (meth)acrylate, acryloyl morpholine, etc. There can be exemplified 2-(2-vinylethoxy)ethyl (meth)arylate as the monofunctional polymerizable monomer that contains vinyl ether group in one molecule as well as one (meth)acrylic group.

Among the polyfunctional polymerizable monomer that has two or more (meth)acrylic groups in one molecule, as bifunctional polymerizable monomer, for example, monomers having alkyleneoxide bond in molecule are preferable. In particularly, there can be exemplified ethylene glycol di(meth)acrylate, propylene glycol di(meth)acrylate, polyolefin glycol di(meth)acrylate having a general formula (1):

[Ka 1]

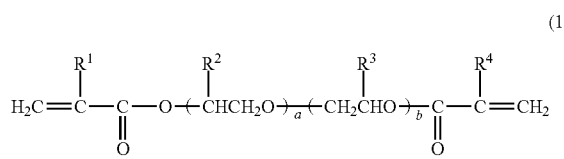

(1)

(wherein $R^1$, $R^2$, $R^3$ and $R^4$ are, independent from each other, hydrogen atom or methyl group; and a and b are an integer of not lower than 0 (zero), respectively, but the mean value of (a+b) is in a range of 2-25).

The polyolefin glycol di(meth)acrylate having the general formula (1) is usually prepared in the form of a mixture of molecules which are different from each other in molecular weight. For that reason, the value of (a+b) is a mean value. The mean value of (a+b) is preferably in a range of 2 to 15, especially in a range of 2 to 10.

As other bifunctional polymerizable monomer, there can be exemplified bifunctional polymerizable monomer that has two (meth)acrylic groups in one molecule (di(meth)acrylate), such as ethoxylated polypropylene glycol di(meth)acrylate, 2-hydroxy-3-acryloyloxypropyl methacrylate, 2-hydroxy-1,3-dimethacryloxypropane, dioxane glycol di(meth)acrylate, tricyclodecanedimethanol di(meth)acrylate, 1,4-butandiol di(meth)acrylate, glycerin di(meth)acrylate, 1,6-hexanediol di(meth)acrylate, 1,9-nonanediol di(meth)acrylate, 1,10-decanediol di(meth)acrylate, neopentylglycol di(meth)acrylate, 2-methyl-1,8-octanediol di(meth)acrylate, 1,9-nonanediol di(meth)acrylate, butylethylpropanediol di(meth)acrylate, 3-methyl-1,5-pentanediol di(meth)acrylate, etc.; di(meth)acrylates having aromatic ring such as ethoxylated bisphenol A di(meth)acrylate, propoxylated ethoxylated bisphenol A di(meth)acrylate, ethoxylated bisphenol F di(meth)acrylate, etc.

As polyfunctional polymerizable monomer that has three or more (meth)acrylic groups in one molecule, there can be exemplified ethoxylated glycerin tri(meth)acrylate, trimethylolpropane tri(meth)acrylate, ethoxylated trimethylolpropane tri(meth)acrylate, propoxylated trimethylolpropane tri(meth)acrylate, pentaerythritol tri(meth)acrylate (trifunctional polymerizable monomers); pentaerythritol tetra(meth)acrylate, di(trimethyrolpropane) tetra(meth)acrylate, ethoxylated pentaerythritol tetra(meth)acrylate (tetrafunctional polymerizable monomers); di(pentaerythritol) poly(meth)acrylate (other polyfunctional polymerizable monomers); etc.

Among the (meth)acrylic group-having polymerizable monomers described above, a polymerizable monomer that contains hydroxyl group, such as 2-hydroxyethyl (meth)acrylate, 2-hydroxypropyl (meth)acrylate, 2-hydroxybutyl (meth)acrylate, hydroxyethyl (meth)acrylamide, hydroxyphenoxyethyl (meth)acrylate, 2-hydroxy-3-phenoxypropyl (meth)acrylate, hydroxyphenoxyethylene glycol modified (meth)acrylate, hydroxyphenoxypropylene glycol modified (meth)acrylate, 2-hydroxy-3-aclyroyloxypropyl (meth)acrylate, 2-hydroxy-1,3-di(meth)aclyroyloxy propane, pentaerythritol tri(meth)acrylate, etc. has excellent adhesion to silicon substrate and can preferably be used solely or in combination with other (meth)acrylic group-having polymerizable monomer that contains no hydroxyl group.

It is desirable to use the (meth)acrylic group-having polymerizable monomer (a) together with a polymerizable monomer that contains acidic group such as phosphate group, carboxylic group, sulfo group besides (meth)acrylic group (a') (hereinafter, refer to as "acidic group-containing polymerizable monomer having (meth)acrylic acidic group").

In the present invention, when a photo-curable resin comprises the acidic group-containing polymerizable monomer having (meth)acrylic group (a') in addition to the (meth)acrylic group-having polymerizable monomer (a), the affinity to alkaline etching liquid is increased and accordingly the photo-curable resin is a desirable embodiment that is suitable to provide easily the effect of invention.

(a') Acidic Group-Containing Polymerizable Monomer Having (Meth)Acrylic Acidic Group There is no particular limitation on the acidic group-containing polymerizable monomer having (meth)acrylic group and the known polymerizable monomer containing phosphate group, carboxylic group, or sulfo group, which is usable in photopolymerization, can be used. The polymerizable monomer containing phosphate group, carboxylic group, or sulfo group may be used in combination.

As the polymerizable monomer containing phosphate group, there can be exemplified mono[2-(meth)acryloyloxyethyl]phosphate, mono[3-(meth)acryloyloxypropyl]phosphate, mono[4-(meth)acryloyloxybutyl]phosphate, mono[5-(meth)acryloyloxypentyl]phosphate, mono[6-(meth)acryloyloxyhexyl]phosphate, mono[7-(meth)acryloyloxyheptyl]phosphate, mono[9-(meth)acryloyloxynonyl]phosphate, mono[10-(meth)acryloyloxydecyl]phosphate, bis[2-(meth)acryloyloxyethyl]phosphate, bis[4-(meth)acryloyloxybutyl)phosphate, bis[6-(meth)acryloyloxyhexyl)phosphate, bis[8-(meth)acryloyloxyoctyl)phosphate, bis[9-(meth)acryloyloxynonyl)phosphate, bis[10-(meth)acryloyloxydecyl)phosphate, mono[1,3-di(meth)acryloyloxypropyl]phosphate, mono[2-(meth)acryloyloxyethylphenyl]phosphate, bis[2-(meth)acryloyloxy-(1-hydroxyethyl)ethyl]phosphate, etc.

As the polymerizable monomer containing carboxylic group, there can be exemplified polymerizable monomer that contains phthalic acid type carboxylic group, such as mono[2-(meth)acryloyloxyethyl]phthalate, mono[2-(meth)acryloyloxyethyl]isophthalate, mono[2-(meth)acryloyloxypropyl]terephthalate, mono[3-(meth)acryloyloxypropyl]phthalate, mono[3-(meth)acryloyloxypropyl]isophthalate, mono[3-(meth)acryloyloxypropyl]terephthalate, mono[2,2,2-tris((meth)acryloyloxymethyl)ethyl]phthalate, mono[2,2,2-tris((meth)acryloyloxymethyl)ethyl]isophthalate, mono[2,2,2-tris((meth)acryloyloxymethyl)ethyl]terephthalate, etc.; polymerizable monomer that contains cyclohexanoic acid type carboxylic group, such as 1,2-cyclohexanedicarboxylic acid mono[2-(meth)acryloyloxyethyl]ester, 1,3-cyclohexanedicarboxylic acid mono[2-(meth)acryloyloxyethyl]ester, 1,4-cyclohexanedicarboxylic acid mono[2-(meth)acryloyloxyethyl]ester, 1,2-cyclohexanedicarboxylic acid mono[3-(meth)acryloyloxypropyl]ester, 1,3-cyclohexanedicarboxylic acid mono[3-(meth)acryloyloxypropyl]ester, 1,4-cyclohexanedicarboxylic acid mono[3-(meth)acryloyloxypropyl]ester, 1,2-cyclohexanedicarboxylic acid mono[2,2,2-tris((meth)acryloyloxymethyl)ethyl]ester, 1,3-cyclohexanedicarboxylic acid mono[2,2,2-tris((meth)acryloyloxymethyl)ethyl]ester, 1,4-cyclohexanedicarboxylic acid mono[2,2,2-tris((meth)acryloyloxymethyl)ethyl]ester, etc.; polymerizable monomer that contains naphthalenedicarboxylic acid type carboxylic group, such as 1,4-naphthalenedicarboxylic acid mono[2-(meth)acryloyloxyethyl]ester, 2,3-naphthalenedicarboxylic acid mono[2-(meth)acryloyloxyethyl]ester, 2,6-naphthalenedicarboxylic acid mono[2-(meth)acryloyloxyethyl]ester, 1,8-naphthalenedicarboxylic acid mono[2-(meth)acryloyloxyethyl]ester, 1,4-naphthalenedicarboxylic acid mono[3-(meth)acryloyloxypropyl]ester, 2,3-naphthalenedicarboxylic acid mono[3-(meth)acryloyloxypropyl]ester, 2,6-naphthalenedicarboxylic acid mono[3-(meth)acryloyloxypropyl]ester, 1,8-naphthalenedicarboxylic acid mono[3-(meth)acryloyloxypropyl]ester, 1,4-naphthalenedicarboxylic acid mono[2,2,2-tris((meth)acryloyloxymethyl)ethyl]ester, 2,3-naphthalenedicarboxylic acid mono[2,2,2-tris((meth)acryloyloxymethyl)ethyl]ester, 2,6-naphthalenedicarboxylic acid mono[2,2,2-tris((meth)acryloyloxymethyl)ethyl]ester, 1,8-naphthalenedicarboxylic acid mono[2,2,2-tris((meth)acryloyloxymethyl)ethyl]ester, etc.; polymerizable monomer that contains trimellitic acid type carboxylic group such as mono[2-(meth)acryloyloxyethyl]trimellitate, di[2-(meth)acryloyloxyethyl]trimellitate, mono[3-(meth)acryloyloxypropyl]trimellitate, di[3-(meth)acryloyloxypropyl]trimellitate, mono[2,2,2-tris((meth)acryloyloxymethyl)ethyl]trimellitate, di[2,2,2-tris((meth)acryloyloxymethyl)ethyl]trimellitate, etc.; polymerizable monomer that contains phenantholenedicarboxylic acid type carboxylic group, such as 4,5-phenantholenedicarboxylic acid mono[2-(meth)acryloyloxyethyl]ester, 4,5-phenantholenedicarboxylic acid mono[3-(meth)acryloyloxypropyl]ester, 4,5-phenantholenedicarboxylic acid mono[2,2,2-tris((meth)acryloyloxymethyl)ethyl]ester, etc.; polymerizable monomer that contains aliphatic carboxylic acid type carboxylic group, such as mono[2-(meth)acryloyloxyethyl]succinate, mono[3-(meth)acryloyloxypropyl]succinate, mono[2,2,2-tris((meth)acryloyloxymethyl)ethyl]succinate, mono[2-(meth)acryloyloxyethyl]fumarate, mono[3-(meth)acryloyloxypropyl]fumarate, mono[2,2,2-tris((meth)acryloyloxymethyl)ethyl]fumarate, mono[2-(meth)acryloyloxyethyl]maleate, mono[3-(meth)acryloyloxypropyl]maleate, mono[2,2,2-tris((meth)acryloyloxymethyl)ethyl]maleate, etc.

As the polymerizable monomer having sulfo group, there can be exemplified 2-(meth)acryloyloxyethane sulfonate, 3-(meth)acryloyloxypropane sulfonate, 4-(meth)acryloyloxybutane sulfonate, 5-(meth)acryloyloxypentane sulfonate, 6-(meth)acryloyloxyhexane sulfonate, 7-(meth)acryloyloxyheptane sulfonate, 8-(meth)acryloyloxyoctane sulfonate, 9-(meth)acryloyloxynonane sulfonate, 10-(meth)acryloyloxydecane sulfonate, 2-(meth)acryloyloxyethyl benzenesulfonate, etc.

In photo-curable resin usable in the present invention, the above-described polymerizable monomer may be used in combination of various kinds of members in accordance with purpose of use, shape of pattern to be formed.

When, in the present invention, the (meth)acrylic group-having polymerizable monomer (a) and the acidic group-containing polymerizable monomer having (meth)acrylic group (a') are used in combination, considering the affinity to alkaline etching liquid, the blending ration ((a)/(a')) of (meth)acrylic group-having polymerizable monomer (a) to acidic group-containing polymerizable monomer having (meth)acrylic group (a') is generally in a range of 95/5-20/80, preferably 90/10-40/60, more preferably 80/20-60/40 in mass ratio.

Furthermore, in the present invention, it is desirable that the resin-comprising composition, especially photo-curable resin-comprising composition comprises a silicon compound in addition to the photo-curable resin that comprises (meth)acrylic group-having polymerizable monomer. Among the silicon compound, it is preferable to use a silicon compound having siloxane bond. In case of adding the silicon compound having siloxane bond, adaptability (dissolution and swelling) of the resin-comprising composition to the alkaline etching liquid that is used in step (C) described below can be provided. As the silicon compound having siloxane bond, though it is possible to use any known compound, an alkoxysilane or a hydrolysate of alkoxysilane can be used. As the hydrolysate of alkoxysilane, for example, the hydrolysate of alkoxysilane described below can be used.

Hydrolysate of Alkoxysilane

The term, "hydrolysate of alkoxysilane", means a product obtained by hydrolysis of a part or all of alkoxy groups of alkoxysilane, polycondensate of alkoxysilane, product obtained by hydrolysis of a part or all of alkoxy groups of the polycondensate and various mixtures thereof.

There is no particular limitation on the alkoxysilane, as long as it has at least one alkoxy group with respect to silicon atom and is hydrolyzable. Besides "general alkoxysilane", alkoxysilane having aromatic ring such as phenyl, naphthyl, biphenyl group as a group other than alkoxy group; alkoxysilane having a functional group such as (meth)acrylic (it means methacrylic group or acrylic group), epoxy, thionyl, hydroxyl, carboxyl, phosphonium, sulfonyl group and etc.; alkoxysilane having halogen atom such as fluorine, chlorine, etc., or mixture thereof may be used. It is desirable that the dispersibility between the hydrolysate of alkoxysilane and the photo-curable resin is good, because the better the dispersibility is, the transcription of pattern can more easily be conducted. In that case, it is desirable that the alkoxysilane has a suitable functional group according to the functional group which the photo-curable resin has, for example, if the photo-curable resin comprises polymerizable monomer having (meth)acrylic group, the resin-comprising composition comprises preferably a hydrolysate of alkoxysilane containing (meth)acrylic group (hereinafter, it may be referred to as "(meth)acrylic group-containing alkoxysilane"), or if the photo-curable resin comprises a polymerizable monomer having epoxy group, the resin-comprising composition comprises preferably a hydrolysate of alkoxysilane having epoxy group.

In the step for transcribing pattern of mold, considering adhesion between the substrate and the pattern and release property on releasing the mold from the pattern, it is desirable to use an alkoxysilane having halogen atom.

The "general alkoxysilane", the (meth)acrylic group-containing alkoxysilane, and the alkoxysilane having halogen atom, which are included into the alkoxysilanes usable in the present invention, will be explained.

General Alkoxysilane

Among alkoxysilanes, as the general alkoxysilane, an alkoxysilan having a general formula (2) can preferably be used.

[Ka 2]

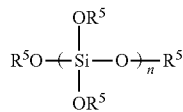

(2)

Wherein, $(R^5)$s are, same or different, $C_{1-4}$ alkyl group; n is an integer of 1-10.

Using hydrolysate of the alkoxysilane described above, the adhesion to silicon substrate is increased and the formation of texture structure by a process with alkaline etching liquid can more easily be conducted in a short time. In case of using hydrolysate of alkoxysilane having n of exceeding 1 among the alkoxysilanes described above, the resulting photo-curable imprint composition is advantageous to transcription of pattern with a comparative low pressure.

As $R^5$ in the general formula (2), that is representative of $C_{1-4}$ alkyl group, there can be exemplified methyl, ethyl, propyl, isopropyl, butyl, sec-butyl, isobutyl, ter.-butyl group, and among them, methyl or ethyl is preferable. Though alkoxy group represented by —$OR^5$ produces an alcohol deriving from $R^5$ in hydrolysis, the resin-comprising composition may contain the alcohol. For that reason, taking account that the alcohol should be the one which can easily be mixed with other components and can easily be removed after forming a coating film on substrate, in particular, $R^5$ is preferably methyl or ethyl.

If n in the general formula (2) satisfies the condition that it is an integer in a range of 1-10, the alkoxysilane may be single compound or a mixture of a plurality of alkoxysilanes having different value of n. In case of using single compound, the value of n is preferably 2-10, more preferably 3-7, considering transcription of pattern with a comparatively low pressure and transcription of fine patter having size of 100 nm or less. On the other hand, in case of using the mixture of a plurality of alkoxysilanes, the mean value of n is preferably 1.1-10. Moreover, considering transcription of pattern with a comparatively low pressure and transcription of fine patter having size of 100 nm or less, the mean value of n is preferably 2-10, more preferably 3-7.

As the alkoxysilane, there can be exemplified tetramethoxysilane, tetraethoxysilane, tetrapropoxysilane, tetrabutoxysilane, and polycondensates thereof. Among them, tetramethoxysilane, tetraethoxysilane, and polycondensates thereof are preferable, because they produce an alcohol which can easily be removed after forming a coating film, or because of reactivity, etc. Especially, tetraethoxysilane having the value of n or mean value of n of 3-7 or polycondensate thereof is preferable.

(Meth)Acrylic Group-Containing Alkoxysilane

As the (meth)acrylic group-containing alkoxysilane, alkoxysilane having a general formula (3) can preferably be used.

[Ka 3]

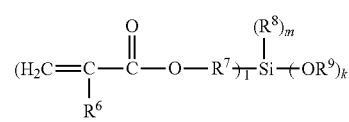

(3)

Wherein, $R^6$ is hydrogen atom or methyl; $R^7$ is $C_{1-10}$ alkylene, $C_{3-10}$ cycloalkylene or $C_{3-10}$ polymethylene; $R^8$ is $C_{1-4}$ alkyl, $C_{3-4}$ cycloalkyl or $C_{6-12}$ aryl; $R^9$ is $C_{1-4}$ alkyl or $C_{3-4}$ cycloalkyl; l is an integer of 1-3, m is an integer of 0-2, k is an integer of 1-3 and (l+m+k) is 4; in case that respective $R^6$, $R^7$, $R^8$ or $R^9$ is present in plural, each of $R^6$(s), $R^7$(s), $R^8$(s) or $R^9$(s) may be same to or different from each other.

Using the (meth)acrylic group-containing alkoxysilane described above, it is possible to obtain a composition having excellent dispersibility and accordingly the purification by filtration becomes easy and productivity can be improved. Also, in case of comprising a hydrolysate of the (meth)acrylic group-containing alkoxysilane, in the fine structure of cured film obtained by photo-curing, the inorganic component and the organic component are relatively homogeneously dispersed (that is, the dispersing state in which the inorganic compound aggregates extremely is not caused). As a result, it is presumed that a uniform transcription pattern and a uniform remaining film can be formed and the variability in etching resistance becomes small.

In the general formula (3), $R^6$ is hydrogen atom or methyl group. Among them, hydrogen atom is preferable, because the photo-curing rate is fast on curing the resin-comprising composition.

$R^7$ is $C_{1-10}$ alkylene group or $C_{3-10}$ cycloalkylene group. In particular, as $C_{1-10}$ alkylene group, there can be exemplified methylene, ethylene, propylene, isopropylene, cyclopropylene, butylene, isobutylene, sec-butylene, tert-butylene, cyclobutylene, cyclopropylmethylene, 2,2-dimethylpropylene, 2-methylbutylene, 2-methyl-2-butylene, 3-methylbutylene, 3-methyl-2-butylene, pentylene, 2-pentylene, 3-pentylene, 2,3-dimethyl-2-butylene, 3,3-dimethylbutylene, 3,3-dimethyl-2-butylene, 2-ethylbutylene, hexylene, 2-hexylene, 3-hexylene, 2-methylpentylene, 2-methyl-2-pentylene, 2-methyl-3-pentylene, 3-methylpentylene, 3-methyl-2-pentylene, 3-methyl-3-pentylene, 4-methylpentylene, 4-methyl-2-pentylene, 2,2-dimethyl-3-pentylene, 2,3-dimethyl-3-pentylene, 2,4-dimethyl-3-pentylene, 4,4-dimethyl-2-pentylene, 3-ethyl-3-pentylene, heptylene, 2-heptylene, 3-heptylene, 2-methyl-2-hexylene, 2-methyl-3-hexylene, 5-methylhexylene, 5-methyl-2-hexylene, 2-ethylhexylene, 6-methyl-2-heptylene, 4-methyl-3-heptylene, octylene, 2-octylene, 3-oxtylene, 2-propylpentylene, 2,4,4-trimethylpentylene, trimethylene, tetramethylene, pentamethylene, hexamethylene, heptamethylene, octamethylene, nonamethylene, decamethylene, etc. Among them, as $C_{1-4}$ alkylene group, methylene, ethylene, propylene, isopropylene, butylene, trimethylene, or tetramethylene is preferable. As $C_{3-10}$ cyclealkylen group, cyclopentylene, cyclohexylene, cyclooctylene, etc. is preferable.

$R^8$ is $C_{1-4}$ alkyl group, $C_{3-4}$ cycloalkyl group, or $C_{6-12}$ aryl group. In particular, there can be exemplified, as $C_{1-4}$ alkyl group, methyl, ethyl, propyl, isopropyl, butyl, isobutyl, sec-butyl, tert-butyl, etc.; as $C_{3-4}$ cycloalkyl group, cyclopropyl, cyclobutyl, cyclopropylmethyl, etc.; as $C_{6-12}$ aryl group, benzene derivative group such as phenyl, benzyl, etc., and naphthalene derivative group such as 1-naphtyl, 2-naphtyl, o-methylnaphtyl, etc. Especially, methyl or ethyl is preferable.

$R^9$ is $C_{1-4}$ alkyl group or $C_{3-4}$ cycloalkyl group. In particular, there can be exemplified, as $C_{1-4}$ alkyl group, methyl, ethyl, propyl, isopropyl, butyl, isobutyl, sec-butyl, tert-butyl, etc.; as $C_{3-4}$ cycloalkyl group, cyclopropyl, cyclobutyl, cyclopropylmethyl, etc. Though alkoxy group represented by $-OR^9$ produces an alcohol deriving from $R^9$ in hydrolysis, the resin-comprising composition used in the present invention may contain the alcohol. For that reason, taking account that the alcohol should be the one which can easily be mixed with other components and can easily be removed after forming a coating film on substrate, in particular, $R^9$ is preferably methyl, ethyl, propyl, isopropyl, or butyl group.

Preferably, l is an integer of 0-2, m is an integer of 0-2, and k is an integer of 1-3, but (l+m+k) is 4.

As the (meth)acrylic group-containing alkoxysilane, there can be exemplified trimethoxysilylmethylene(meth)acrylate, trimethoxysilyldimethylene(meth)acrylate, trimethoxysilyltrimethylene(meth)acrylate, triethoxysilylmethylene(meth)acrylate, triethoxysilyldimethylene(meth)acrylate, triethoxysilyltrimethylene(meth)acrylate, tripropoxysilylmethylene(meth)acrylate, tripropoxysilylethylene (meth)acrylate, tripropoxysilyltrimethylene(meth)acrylate, tributoxysilylmethylene(meth)acrylate, tributoxysilyldimethylene(meth)acrylate, tributoxysilyltrimethylene(meth)acrylate, triisopropoxysilylmethylene(meth)acrylate, triisopropoxysilyldimethylene(meth)acrylate, triisopropoxysilyltrimethylene(meth)acrylate, dimethoxymethylsilylmethylene(meth)acrylate, dimethoxymethylsilyldimethylene(meth)acrylate, dimethoxymethylsilyltrimethylene(meth)acrylate, diethoxymethylsilylmethylene(meth)acrylate, diethoxymethylsilyldimethylene(meth)acrylate, diethoxymethylsilyltrimethylene(meth)acrylate, dimethoxyethylsilylmethylene(meth)acrylate, dimethoxyethylsilyldimethylene(meth)acrylate, dimethoxyethylsilyltrimethylene(meth)acrylate, diethoxyethylsilylmethylene(meth)acrylate, diethoxyethylsilyldimethylene(meth)acrylate, diethoxyethylsilyltrimethylene(meth)acrylate, methoxydimethylsilylmethylene(meth)acrylate, methoxydimethylsilyldimethylene(meth)acrylate, methoxydimethylsilyltrimethylene(meth)acrylate, ethoxydimethylsilylmethylene(meth)acrylate, ethoxydimethylsilyldimethylene(meth)acrylate, ethoxydimethylsilyltrimethylene(meth)acrylate, methoxydiethylsilylmethylene(meth)acrylate, methoxydiethylsilyldimethylene(meth)acrylate, methoxydiethylsilyltrimethylene(meth)acrylate, ethoxydiethylsilylmethylene(meth)acrylate, ethoxydiethylsilyldimethylene(meth)acrylate, ethoxydiethylsilyltrimethylene(meth)acrylate, etc. In particular, trimethoxysilyltrimethylene(meth)acrylate or triethoxysilyltrimethylene(meth)acrylate is preferable.

Alkoxysilane Having Halogen Atom

As the alkoxysilane having halogen atom described above, there can be exemplified a fluorinated silane compound having a general formula (4):

[Ka 4]

(4)

(wherein each of $R^{10}$ and $R^{12}$ is $C_{1-10}$ alkyl group or $C_{3-10}$ cycloalkyl group; $R^{11}$ is fluorine-containing alkyl group, fluorine-containing cycloalkyl group, or fluorine-containing alkoxy ether group; a is an integer of 1-3 and b is an integer of 0-2, but (a+b) is 1-3; in case that each of $R^{10}$, $R^{11}$ and $R^{12}$ is present in plural, each of $(R^{10})$s, $(R^{11})$s and $(R^{12})$s may be same or different). Using a hydrolysate of the fluorinated silane compound, it is possible to improve the adhesion between the pattern and the substrate and the release property from mold.

In the general formula (4), $R^{10}$ and $R^{12}$ are $C_{1-10}$ alkyl group or $C_{3-10}$ cycloalkyl group, respectively and there can preferably be exemplified methyl, ethyl, propyl, isopropyl, butyl, sec-butyl, isobutyl, tert-butyl, etc. Though alkoxy group represented by $-OR^{10}$ in the general formula (4) produces an alcohol deriving from $R^{10}$ in hydrolysis, the composition for photo-curable nanoimprint used in the present invention may contain the alcohol. For that reason, taking account that the alcohol should be the one which can easily be mixed with other components and can easily be removed after forming a coating film on substrate, in particular, $R^{10}$ is preferably methyl, ethyl, propyl, isopropyl, butyl group, etc.

$R^{11}$ is fluorine-containing alkyl group, fluorine-containing cycloalkyl group, or fluorine-containing alkoxy ether group. The term "fluorine-containing alkyl group" means that one or two or more hydrogen atoms of alkyl group are substituted with fluorine atom and similarly the "fluorine-containing cycloalkyl group" or "fluorine-containing alkoxy ether group" means that one or two or more hydrogen atoms of cycloalkyl group or alkoxy ether group are substituted with fluorine atom, respectively. The carbon number of fluorine-containing alkyl group and fluorine-containing alkoxy group is preferably 1-10 and the carbon number of fluorine-containing alkoxy ether group is preferably 3-10. Especially, the fluorine-containing alkoxy ether group is preferably the one obtaining by substituting one or two or more hydrogen atoms with fluorine atom in alkoxy ether group represented by a general formula (5):

[Ka 5]

(5)

(wherein, x is an integer of 1 or more, y is an integer of 2 or more). In the general formula (5), x is preferably 1-6 and y is preferably 5-50.

As the fluorinated silane compound, there can be exemplified (heptadecafluoro-1,1,2,2-tetrahydrodecyl)-triethoxysilane, (heptadecafluoro-1,1,2,2-tetrahydrodecyl)-trimethoxysilane, nonafluorohexyltriethoxysilane, nonafluorohexyltrimethoxysilane, (tridecafluoro-1,1,2,2-tetrahydrooctyl)-triethoxysilane, (tridecafluoro-1,1,2,2-tetrahydrooctyl)-trimethoxysilane, pentafluoro-1,1,2,2-tetrahydropentyl-triethoxysilane, pentafluoro-1,1,2,2-tetrahydropentyl-trimethoxysilane, (3,3,3-trifluoropropyl) dimethylethoxysilane, (3,3,3-trifluoropropyl) dimethylmethoxysilane, (3,3,3-trifluoropropyl) methyldiethoxysilane, (3,3,3-trifluoropropyl) methyldimethoxysilane, (3,3,3-trifluoropropyl) triethoxysilane, (3,3,3-trifluoropropyl)trimethoxysilane, perfluoropropyltriethoxysilane, perfluoropropyltrimethoxysilane, 5,5,6,6,7,7,8,8,9,9,10,10,10-tridecafluoro-2-(tridecafluorohexy 1) decyltriethoxysilane, 5,5,6,6,7,7,8,8,9,9,10, 10,10-tridecafluoro-2-(tridecafluorohexy 1) decyltrimethoxysilane, perfluorododecy-1H,1H,2H,2H-triethoxysilane, perfluorododecy-1H,1H,2H,2H-trimethoxysilane, perfluorotetradecy-1H,1H,2H,2H-triethoxysilane, perfluorotetradecy-1H,1H,2H,2H-trimethoxysilane, 3-(perfluorocyclohexyloxy)propyltrimethoxysilane, etc. As example of fluorinated silane compound having the general formula (4) in which $R^{11}$ is fluorine-containing alkoxy ether group, there can be exemplified a commercially available product OPTOOL-DSX (trade name: DAIKIN INDUSTRIES, LTD.). In particular, considering weak interaction between molecules and therefore turbulence in molecule array structure, which are advantageous to surface detachability, and ease of hydrolysis of alkoxy group represented by $-OR^6$ in the general formula (4), (tridecafluoro-1,1,2,2-tetrahydrooctyl)triethoxysilane or (3,3,3-trifluoropropyl)trimethoxysilane is preferable.

In the present invention, when, for example, the resin-comprising composition comprises (meth)acrylic group-having polymerizable monomer, as hydrolysate of alkoxysilane, a hydrolysate of the (meth)acrylic group-containing alkoxysilane represented by the general formula (3) is preferably used, more preferably a hydrolysate of the general alkoxysilane represented by the general formula (2), the (meth)acrylic group-containing alkoxysilane represented by the general formula and the fluorinated silane compound that is one of the alkoxysilane having halogen atom represented by the general formula (4), and most preferably a hydrolysate of mixture comprising metal alkoxide described below in addition to those alkoxysilanes.

In the present invention, when, for example, the photo-curable resin comprises (meth)acrylic group-having polymerizable monomer, a desirable blending amount of the hydrolysate of alkoxysilane is as follows: in case that the hydrolysate is the hydrolysate of (meth)acrylic group-having alkoxysilane, it is a such blending amount that 3-300 parts by mass of the (meth)acrylic group-having alkoxysilane is hydrolyzed with respect to 100 parts by mass of (meth)acrylic group-having polymerization monomer; in case of the hydrolysate of general alkoxysilane, it is a such blending amount that 10-250 parts by mass of the general alkoxysilane is hydrolyzed; in case of the hydrolysate of fluorinated silane compound, it is a such blending amount that 0.001-4 parts by mass of the fluorinated silane compound is hydrolyzed; and in case of the metal oxide described below, it is a such blending amount that 1-50 parts by mass of the metal oxide is hydrolyzed. Using the composition for photo-curable imprint, the transcription of pattern by mold can be conducted at a low pressure and it is possible to carry out thinning of pattern by thermal treatment. The composition comprising the resin has good dispersability and contracts equally and homogeneously in thermal treatment. Though reflecting not exactly the chemical structure of resin-comprising composition used in the present invention, for example, in case the photo-curable resin comprises the polymerizable monomer having (meth)acrylic group, it is desirable that in order to make compatible adhesion to substrate and releasing property from mold, the composition comprising the hydrolysate of alkoxysilane satisfies the following composition. Namely, it is desirable that, converting conveniently the amount of the general alkoxysilane, the (meth)acrylic group-containing alkoxysilane, or the metal alkoxide into amount of oxide, the composition for photo-curable imprint comprises the hydrolysate in such amount of 3-100 parts by mass (as silicon oxide converting amount) of general alkoxysilane, 1-80 parts by mass (as silicon oxide converting amount) of (meth) acrylic group-containing alkoxide, or 1-5 parts by mass (as metal oxide converting amount) of metal alkoxide with respect to 100 parts by mass of (meth)acrylic group-having polymerizable monomer. The "oxide converting amount" means the amount that is calculated assuming that all of contained silicon molecule are oxide and is a value calculated form blending amount.

It is desirable that the amount of water which is used in the hydrolysis of alkoxysilane is in a range of not less than 0.1 times but less than 1.0 times with respect to the mole number of all alkoxy groups. It is also desirable that in case that the photo-curable nanoimprint composition comprises, as alkoxysilane, the fluorinated silane compound represented by the above-described general formula (4) and the metal alkoxide described below, the amount water is in a range of not less than 0.1 times but less than 1.0 times with respect to the mole number of all alkoxy groups. In case that the amount of water is not less than 0.1 mole times, the condensation is sufficiently caused and the "repelling" is hardly caused due to good wettability on forming coating film, and accordingly it is desirable. On the other hand, in case of less than 1.0 mole times, it is possible to carry out the formation of patter with a relatively low pressure and the damage of mold is hardly caused and accordingly it is desirable. Considering the degree of condensation and the formation of pattern with a relatively low pressure, the amount of water is preferably in a range of 0.2-9 mole times, more preferably a range of 0.3-0.8 mole times with respect to the mole number of all alkoxy groups.

An acid may be used together with water in hydrolysis. As the acid, there can be exemplified inorganic acids such as hydrochloric acid, nitric acid, sulfuric acid, phosphoric acid, polyphosphoric acid etc.; organic acids such as organic phosphoric acid, formic acid, acetic acid, acetic anhydride, chloroacetic acid, propionic acid, butyric acid, valeric acid, citric acid, gluconic acid, succinic acid, tartaric acid, lactic acid, fumaric acid, malic acid, itaconic acid, oxalic acid, mucic acid, uric acid, barbituric acid, p-toluenesulfonic acid, etc.; acidic cation-exchange resin; etc.

The resin-comprising composition may comprise water, acid, etc. which can be used in hydrolysis of alkoxysilane.

When the composition comprising photo-curable resin comprises the (meth)acrylic group-having polymerizable monomer, it may comprise a hydrolysate of alkoxysilane such as the general alkoxysilane, the (meth)acrylic group-containing alkoxysilane, or fluorinated silane compound that is one of the alkoxysilane having halogen atom, etc. and of the metal alkoxide. The hydrolysate of alkoxysilane and metal alkoxide usable in the present invention can be prepared by mixing the material to be hydrolyzed, that is, alkoxysilane, (meth)acrylic group-containing alkoxysilane (in case of the composition comprising photo-curable resin) and if necessary, fluorinated silane compound and metal alkoxide with water in the amount described above. There is no particular limitation on method for mixing water. However, it is desirable that, in order to prepare a homogeneous composition comprising resin, the materials to be hydrolyzed are blended at first and then water is added and the hydrolysis is conducted. Though there is no particular limitation, the mixing of materials with water may be carried out at a temperature of 5-35° C. At this time, in order to advance easily the hydrolysis, a diluent solvent may be used. It is preferable to use $C_{1-4}$ alcohol, especially ethanol as the solvent for dilution.

The resin-comprising composition comprises further photoinitiator. There is no particular limitation on the photoinitiator and any photoinitiator can be used, provided that it has the ability to photopolymerize the polymerizable monomer.

As the photoinitiator, there can specifically be exemplified acetophenone derivatives such as 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-hydroxy-1-{4-[4-(2-hydroxy-2-methylpropionyl)-benzyl]-phenyl}-2-methyl-1-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-butanone-1,2,2-dimethylamino-2-(4-methylbenzyl)-1-(4-morpholin-4-yl-phenyl) butan-1-one, etc.; acylphosphine oxide derivatives such as 2,4,6-trimethylbenzoyldiphosphine oxide, 2,6-dimethoxybenzoyldiphenylphosphine oxide, 2,6-dichlorobenzoyldiphenylphosphine oxide, 2,4,6-trimethylbenzoylphenylphosphinic acid methyl ester, 2-methylbenzoyldiphenylphosphine oxide, pivaloylphenylphosphinic acid isopropyl ester, bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphtylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, bis-(2,4,6-trimethylbenzoyl)phenylphosphine oxide, bis-(2,5,6-trimethylbenzoyl)-2,4,4-trimethylpentylphosphine oxide, etc.; O-acyloxime derivatives such as 1,2-octanedione, 1-[4-(phenylthio)phenyl-,2-(O-benzoyloxime)], ethanone, 1-[9-ethyl-6-(2-methylbenzoyl)-9H-carbazol-3-yl], 1-(O-acetyloxime), etc.; α-diketones such as diacetyl, acetylbenzoyl, benzil, 2,3-pentandione, 2,3-octandione, 4,4'-dimethoxybenzil, 4,4'-dihydroxybenzil, camphorquinone, 9,10-phenanthrenequinone, acenaphthenequinone, etc.; benzoin alkyl ethers such as benzoin methyl ether, benzoin ethyl ether, benzoin propyl ether, etc.; thioxanthone derivatives such as 2,4-diethoxythioxanthone, 2-chlorothioxanthone, methylthioxanthone, etc.; benzophenone derivatives such as benzophenone, p,p'-bis(dimethylamino)benzophenone, p,p'-dimethoxybenzopehnone, etc.; titanocene derivatives such as bis-($\eta^5$-2,4-cyclopentadien-1-yl)-bis(2,6-difluoro-3-(1H-pyrol-1-yl)-phenyl)titanium, etc. Further, as photoinitiators for cationic polymerization, a photo acid generator can be used. As the photo acid generators, there can be exemplified diaryliodonium salt compound that consists of a cation such as diphenyliodonium, bis(p-chlorophenyl)iodonium, bis(tolyl)iodonium, bis(p-tert-butylphenyl)iodonium, p-isopropylphenyl-p-methylphenyliodonium, bis(m-nitrophenyl)iodonium, p-tert-butylphenylphenyliodonium, p-methoxyphenylphenyliodonium, bis(p-methoxyphenyl)iodonium, p-octyloxyphenylphenyliodonium, p-phenoxyphenyliodonium, etc. and an anion such as chloride, bromide, p-toluenesulfonate, trifluoromethanesulfonate, tetrafluorobolate, tetrakis(pentafluorophenyl)borate, tetrakis(pentafluorophenyl)gallate, hexafluorophosphate, hexafluoroarsenate, hexafluoroantimonate, etc.; sulfonium salt compound that consists of a cation such as dimethylphenacylsulfonium, dimethylbenzylsulfonium, dimethyl-4-hydrozyphenylsulfonium, dimethyl-4-hydroxynaphthylsulfonium, dimethyl-4,7-dihydroxynaphthylsulfonium, dimethyl-4,8-dihydroxynaphthylsulfonium, triphenylsulfonium, p-tolyldiphenylsulfonium, p-tert-butylphenyldiphenylsulfonium, diphenyl-4-phenylthiophenylsulfonium, etc. and an anion such as chloride, bromide, p-toluenesulfonate, trifluoromethanesulfonate, tetrafluorobolate, tetrakis(pentafluorophenyl)borate, tetrakis(pentafluorophenyl)gallate, hexafluorophosphate, hexafluoroarsenate, hexafluoroantimonate, etc.; sulfonic acid ester compound; halomethyl substituted-S-triazine derivative; etc. Most of the above-described photo acid generators are generally a compound having no absorption in near-violet to visible range and accordingly, there are many cases in which a special light source is required in order to excite a polymerization. For that reason, it is preferable to add a compound having absorption in near-violet to visible range as a sensitizer to the photo acid generator. As compound usable as the sensitizer, there can be exemplified, for example, acridine dye, benzoflavin dye, fused polycyclic aromatic compound such as anthracene, perylene, etc., phenothiazine, etc. As the fused polycyclic aromatic compound, there can specifically be exemplified 1-methylnaphthalene, 1-ethylnaphthalene, 1,4-dimethylnaphthalene, acenaphthene, 1,2,3,4-tetrahydrophenantholene, 1,2,3,4-tetrahydroanthrathene, benzo[f]phthlane, benzo[g]chroman, benzo[g]isochroman, N-methylbenzo[f]indoline, N-methylbenzo[f]isoindoline, phenalene, 4,5-dimethylphenanthrene, 1,8-dimethylphenanthrene, acephnanthrene, 1-methylanthrathene, 9-methylanthrathene, 9-ethylanthrathene, 9-cyclohexylanthrathene, 9,10-dimethylanthrathene, 9,10-diethylanthrathene, 9,10-dicyclohexylanthrathene, 9-methoxymethylanthrathene, 9-(1-methoxyethyl)anthrathene, 9-hexyloxymethylanthrathene, 9,10-dimethoxymethylanthrathene, 9-dimethoxymethylanthrathene, 9-phenylmethylanthrathene, 9-(1-naphthyl)methylanthrathene, 9-hydroxymethylanthrathene, 9-(1-hydroxyethyl)anthrathene, 9,10-dihydroxymethylanthrathene, 9-acetoxymethylanthrathene, 9-(1-acetoxyethyl)anthrathene, 9,10-diacetoxymethylanthrathene, 9-benzoyloxymethylanthrathene, 9,10-dibenzoyloxymethylanthrathene, 9-ethylthiomethylanthrathene, 9-(1-ethylthioethyl)anthrathene, 9,10-bis(ethylthiomethyl)anthrathene, 9-mercaptomethylanthrathene, 9-(1-mercaptoethyl)anthrathene, 9,10-bis(mercaptomethyl)anthrathene, 9-ethylthiomethyl-10-vinylanthrathene, 9-methyl-10-phenylanthrathene, 9-methyl-10-vinylanthrathene, 9-allylanthrathene, 9,10-diallylanthrathene, 9-chloromethylanthrathene, 9-bromomethylanthrathene, 9-iodomethylanthrathene, 9-(1-chloroethyl)anthrathene, 9-(1-bromoethyl)anthrathene, 9-(1-iodoethyl)anthrathene, 9,10-dichloromethylanthrathene, 9,10-dibromomethylanthrathene, 9,10-diiodomethylanthrathene, 9-chloro-10-methylanthrathene, 9-chloro-10-ethylanthrathene, 9-bromo-10-methylanthrathene, 9-bromo-10-ethylanthrathene, 9-iodo-10-methylanthrathene, 9-iodo-10-ethylanthrathene, 9-methyl-10-dimethylaminoanthrathene, aceanthrene, 7,12-dimethylbenz(a)anthrathene, 7,12-dimethoxymethylbenz(a)anthrathene, 5,12-dimethylnaphthacene, cholanthrene, 3-methylcholanthrene, 7-methylbenz (a)pyrene, 3,4,9,10-tetramethylperylene, 3,4,9,10-tetrakis (hydroxymethyl)perylene, violanthrene, isoviolanthrene, 5,12-dimethylnaphthacene, 6,13-dimethylpenthacene, 8,13-dimethylpentaph-5,16-dimethylhexacene, 9,14-dimethylhexaphene, naphthalene, phenanthrene, anthracene, naphthacene, benz[a]anthracene, pyrene, perylene, etc.

The photoinitiator may be used alone or in the form of a mixture of at least two members.

In case of using α-diketone, it is preferably used in combination with tertiary amine compound. As the tertiary amine compound used in combination with α-diketone, there can be exemplified N,N-dimethylaniline, N,N-diethylaniline, N,N-di(n-butyl)aniline, N,N-dibenzylaniline, N,N-dimethyl-p-toluidine, N,N-diethyl-p-toluidine, N,N,-dimethyl-m-toluidine, p-bromo-N,N-dimethylaniline, m-chloro-N,N-dimethylaniline, p-dimethylaminobenzaldehyde, p-dimethylaminoacetophenone, p-dimethylaminobenzoic acid, p-dimethylaminobenzoic acid ethyl ester, p-dimethylaminobenzoic acid amyl ester, N,N-dimethylanthranilic acid methyl ester, N,N-dihydroxyethylaniline, N,N-dihydroxyethyl-p-toluidine, p-dimethylaminophenetyl alcohol, p-dimethylaminostilbene, N,N-dimethyl-3,5-xylidine, 4-dimethylaminopylidine, N,N-dimethyl-α-naphthylamine, N,N-dimethyl-β-naphthylamine, tributylamine, tripropylamine, triethylamine, N-methyldiethanolamine, N-ethyldiethanolamine, N,N-dimethylhexylamine, N,N-dimethyldodecylamine, N,N-dimethylstearylamine, N,N-dimethylaminoethyl methacrylate, N,N-diethylaminoethyl methacrylate, 2,2'-(n-butylimino)diethanol, etc.

The resin-comprising composition usable in the present invention may comprise other additives provided that they do not affect adversely the effects of the present invention.

On using the resin-comprising composition usable in the present invention, the resin-comprising composition is used by applying it to a substrate. In this case, the resin-comprising composition may be diluted with a solvent. For purpose of stabilizing the resin-comprising composition usable in the present invention and for other purposes, a solvent may be added. There is no particular limitation on the solvent to be used and any solvent may be used provided that it has the ability to dissolve the resin-comprising composition usable in the present invention. There can be exemplified, for example, acetonitrile, tetrahydrofuran, toluene, chloroform, ethyl acetate, methyl ethyl ketone, dimethylformamide, cyclohexanone, ethylene glycol, propylene glycol, propylene glycol methyl ether, propylene glycol monomethyl ether acetate, methyl-3-methoxypropionate, ethylene glycol monoethyl ether acetate, ethyl lactate, ethyl-3-ethoxypropionate, butyl acetate, 2-heptanone, methyl isobutyl ketone, acetylacetone, polyethylene glycol, water, alcohol. Water and alcohol may newly be added, or water which has been used in the preparation of partial hydrolysate and alcohol which has been by-produced in the preparation of partial hydrolysate may be used. Also, the solvent may contain the diluent solvent which has been used in the preparation of partial hydrolysate.

The resin-comprising composition usable in the present invention may comprise other known additives. Particularly, the additives such as surfactant, polymerization inhibitor, reactive diluent, etc. may be added. In view of uniformity of coating film, a surfactant may be added, and a polymerization inhibitor may be added in order to stabilize so that the polymerization is not caused during preservation.

As surfactant, aliphatic surfactant, silicone-based surfactant, fluorine-having surfactant may be used.

As example of aliphatic surfactant, there can be exemplified anionic surfactants such as metal salts of higher fatty alcohol sulfate such as sodium decyl sulfate, sodium lauryl sulfate, etc., metal salts of aliphatic carboxylic acid such as sodium laurate, sodium stearate, sodium oleate, etc., metal salts of higher alkyl ether sulfate such as sodium lauryl ether sulfate (prepared by sulfating an adduct of lauryl alcohol and ethylene oxide), etc., sulfosuccinic acid diesters such as sodium sulfosuccinate, etc., salts of phosphate of fatty alcohol ethylene oxide adduct, etc.; cationic surfactants such as alkyl amine salts such as dodecylammonium chloride, etc. and quaternary ammonium salts such as trimethyldodecylammonium bromide, etc.; amphoteric surfactants such as alkyldimethylamine oxides such as dodecyldimethylamine oxide, etc., alkylcarboxybetaines such as dodecylcarboxybetaine, etc., alkylsulfobetaines such as dodecylsulfobetaine, etc., amidoamino acid salts such as lauramidopropylamine oxide, etc.; nonionic surfactants such as polyoxyethylene alkyl ethers such as polyoxyethylene lauryl ether, etc., polyoxyalkylene alkyl ethers, polyoxyethylene distyrenated phenyl ethers, polyoxyethylene alkylpehnyl ethers such as polyoxyethylene laurylphenyl ether, etc., polyoxyethylene tribenzylphenyl ethers, fatty acid polyoxyethylene esters such as fatty acid polyoxyethylene laurate, polyoxyethylenesorbitan esters such as polyoxyethylenesorbitan laurate, etc.

As example of silicone-based surfactant, there is no particular limitation and there can be exemplified polyether modified silicone, polyglycerin modified silicone, (meth)acryl modified silicone, etc., in which organic silicon group is modified to a hydrophobic group.

As example of fluorine-having surfactant, there is no particular limitation and there can be exemplified fluorine compounds provided with polymerizing property such as compounds prepared by substituting a part or all of hydrogen atoms in alkyl chain of aliphatic surfactant with fluorine atom, (meth)acrylic acid fluoroalcohol ester, etc.

The surfactant may be used alone or in combination of members of plural kinds.

As example of polymerization inhibitor, there can be exemplified the known compounds and as the most representative polymerization inhibitor, there can be exemplified hydroquinone monomethyl ether, hydroquinone, propylhydroxytoluene, etc.

As reactive diluent, there can be exemplified the known compounds such as N-vinylpyrrolidone, etc.

Also, as other additives, spherical fine particle such as hyperbranched polymers may be added. In this case, it is preferable to add the spherical hyperbranched polymer having the diameter of 1-10 nm, the molecular weight of 10,000-100,000, in view of prevention of pattern collapse (due to relaxation of stress from side wall of mold) on peeling a mold from photo-cured coating film after transcription of pattern by mold.

In the present invention, the resin-comprising composition may comprise further a hydrolysate of metal alkoxide (except alkoxysilane), said metal alkoxide having a general formula (6):

[Ka 6]

$$M\text{-}(OR^{13})_4 \quad (6)$$

(wherein, M is zirconium or titanium; and $(R^{13})$s are, same or different, $C_{1-10}$ alkyl group).

Though the resin-comprising composition used in the present invention can form easily the texture structure having excellent adhesion to silicon substrate by processing with alkaline etching liquid for a short time, when the metal alkoxide is blended to the resin-comprising composition, it is possible to carry out more finely the formation of texture structure by the process with alkaline etching liquid without damaging the adhesion to silicon substrate, effects such as easy of formation, process in a short time, etc.

It is desirable that M in the general formula (6) is zirconium in order to carry out more finely the formation of texture structure by processing with alkaline etching liquid.

$R^{13}$ is preferably $C_{2-4}$ alkyl group in view of adequate hydrolysis rate. Though alkoxy group represented by —$OR^{13}$ produces an alcohol deriving from $R^{13}$ in hydrolysis, the resin-comprising composition used in the present invention may contain the alcohol. For that reason, considering that the —$OR^{13}$ produces an alcohol which can easily be mixed with other components and can easily be removed after forming a coating film on substrate, in particular, $R^{13}$ is preferably ethyl, propyl, isopropyl, butyl, isobutyl group.

As a suitable example of metal alkoxide, there can be exemplified tetramethyltitanium alkoxide, tetraethyltitanium alkoxide, tetraisopropyltitanium alkoxide, tetrapropyltitanium alkoxide, tetraisobutyltitanium alkoxide, tetrabutyltitanium alkoxide, tetrapentyltianium alkoxide, tetraheptyltitanium alkoxide, tetrahexyltitanium alkoxide, tetraheptyltitanium alkoxide, tetraoctyltitanium alkoxide, tetranonyltitanium alkoxide, tetradecyltitanium alkoxide, tetramethylzirconium alkoxide, tetraethylzirconium alkoxide, tetraisopropylzirconium alkoxide, tetrapropylzirconium alkoxide, tetraisobutylzirconium alkoxide, tetrabutylzirconium alkoxide, tetrapentylzirconium alkoxide, tetrahexylzirconium alkoxide, tetraheptylzirconium alkoxide, tetraoctylzirconium alkoxide, tetranonylzirconium alkoxide, tetradecylzirconium alkoxide. Among them, tetraethylzirconium alkoxide, tetraisopropylzirconium alkoxide, tetorapropylzirconium alkoxide, tetraisobutylzirconium alkoxide, tetrabutylzirconium alkoxide are preferable.

It is desirable that the amount of water which is used in the hydrolysis of metal alkoxide is in a range of not less than 0.1 times but less than 1.0 times with respect to the mole number of the total alkoxy groups including alkoxide group of alkoxysilane. In case that the amount of water is not less than 0.1 mole times, the condensation is sufficiently caused and the "repelling" is hardly caused due to good wettability on forming coating film, and accordingly it is desirable. On the other hand, in case of less than 1.0 mole times, it is possible to carry out the formation of patter with a relatively low pressure and the damage of mold is hardly caused, and accordingly it is desirable. Considering the degree of condensation and the formation of pattern with a relatively low pressure, the amount of water is preferably in a range of 0.2-9 mole times, more preferably 0.3-0.8 mole times with respect to the mole number of all alkoxy groups.

The resin-comprising composition used in the present invention, especially a photo-curable resin-comprising composition can be prepared by blending the hydrolysate of alkoxysilane, the (meth)acrylic group-having polymerizable monomer, optionally acidic group-containing polymerlyzable monomer having (meth)acrylic group, photoinitiator, and hydrolysate of metal alkoxide that is blended if necessary, and other additives. There is no particular limitation on the order of addition of ingredients.

In the present invention, it is not necessary to use a silicon substrate which has been subjected to the process for forming surface oxide film and in view of reducing manufacturing process, a silicon substrate which has not been subjected to the process for forming surface oxide film can preferably be used.

Step (B) of Irradiating Etching Gas to Silicon Substrate Surface Other than Pattern Portion The silicon substrate having the pattern formed in the above-described step (A) is subjected to an irradiation of etching gas, whereby the silicon substrate surface other than the pattern portion is irradiated with the etching gas. The expression, "silicon substrate surface other than pattern", used herein means a portion of silicon substrate surface except the silicon substrate surface just under the pattern portion of the resin-comprising composition, which is formed on the silicon substrate in the step (A). In other words, the pattern portion may be irradiated with the etching gas as long as the silicon substrate surface existing just under the pattern portion is not irradiated with the etching gas.

Even if the etching gas is irradiated to the pattern, the silicon substrate surface just under the pattern portion is generally not irradiated with the etching gas. For this reason, the irradiation of etching gas in the step (B) can usually be carried by a method in which the etching gas is irradiated to substantially the whole of the pattern 2 composed of the pattern portion 3 and the remaining film 4.

It can be observed that after the step (B), the silicon substrate surface other than the pattern portion may have an increased etching resistance to alkaline etching liquid used in the subsequent Step (C) depending on type of the used etching gas.

Though the mechanism of increment of etching resistance to alkaline etching liquid used in the Step (C) has not been clarified, the following two possible mechanisms are assumed.

The first mechanism resides in formation of very thin mask layer deriving from the etching gas (in case of fluorine-containing gas, water-repellent layer; in case of oxygen gas, partial oxide layer). It is considered that in this mechanism, the degree of effect depends on type of the used etching gas. It is assumed that a some kind of chemical modification is caused by the irradiation of etching gas, whereby the silicon substrate surface other than the pattern portion has the increased etching resistance to alkaline etching liquid used in the Step (C). As the etching gas, the known gases which are used in dry etching can be used. However, an etching gas that can cause some kind of chemical and/or physical modification on the silicon substrate and increase the etching resistance to the alkaline etching liquid is preferably used. As the etching gas, there can be exemplified fluorine-containing gas, oxygen gas, etc. Among them, it is preferable to used fluorine-containing gas. There can be exemplified, as fluorine-containing gas, sulfur hexafluoride, silicon tetrafluoride, fluoromethane, difluoromethane, trifluoromethane, tetrafluoromethane. A gas mixture of at least two members of fluorine-containing gas or oxygen gas may be used as the etching gas.

As a method for irradiating the etching gas to the silicon substrate surface, the known procedure of dry etching can be used. There can be exemplified spattering, ion milling, focused ion beam process, radical etching, reactive ion etching, neutral beam etching, plasma etching, inductively coupled plasma, atmospheric pressure plasma, etc.

The second mechanism is as follows: In case that the resin-comprising composition used in the step (A) has good adaptability (solubility, wettability) to the alkaline etching liquid, when the etching gas is irradiated to the silicon substrate surface, the neighboring place of the root of the pattern portion at which the pattern portion contacts with the substrate is a zone at which the very thin mask layer deriving from the etching gas is hardly formed due to masking effect, and accordingly the etching process with the alkaline etching liquid used in the Step (C) will proceed preferentially from the border between the pattern portion and the substrate. It is considered that on this occasion, the progress of etching with alkaline etching liquid is fasten provided that the resin-comprising composition has an adequate adaptability (solubility and wettability) to the alkaline etching liquid.

Regarding the adequate adaptability (solubility and wettability) to an alkali treatment, it is desirable that the resin-comprising composition used to form the pattern comprises hydrolysate of mixture of the general alkoxysilane and the (meth)acrylic group-containing alkoxysilane or hydrolysate of mixture of the general alkoxysilane, the (meth)acrylic group-containing alkoxysilane and the metal alkoxide, and the resin-comprising composition which comprises hydrolysate of mixture of the general alkoxysilane and the (meth) acrylic group-containing alkoxysilane and the metal alkoxide is more preferable.

As an adequate combination of etching gas and resin-comprising composition, the combinations that can provide either or both of the first and second mechanisms described above are used and the combination that can provide both mechanisms is preferably used. For example, even if argon gas is used as the etching gas and the resin-comprising composition which comprises the hydrolysate of mixture of the general alkoxysilane, the (meth)acrylic group-containing alkoxysilane and the metal alkoxide is used as the resin-comprising composition (the second mechanism is provided), the silicon substrate having texture structure of the present invention can be manufactured. But, in order to form the texture structure having regularly and finely arranged pattern, the combination in which fluorine-containing gas is used as the etching gas and the resin-comprising composition which comprises the hydrolysate of mixture of the general alkoxysilane, the (meth)acrylic group-containing alkoxysilane and the metal alkoxide is used as the resin-comprising composition (both the first and second mechanisms are provided) is most preferable.

In case that imprint is employed as method for forming pattern, when a mold is pressed against the coating film, in the border in which the mold surface contacts with the silicon substrate surface, a thin remaining film is formed in the zone between the pattern portions, besides the pattern portion. In this case, in order to increase the etching resistance to alkaline etching liquid of the silicon substrate surface other than the silicon substrate surface covered by the pattern portion, it is necessary to remove firstly the remaining film by the etching gas. The mechanism of increasing the etching resistance to alkaline etching liquid is as described above (but presumption). Even in the case that a gas, for example argon (Ar) gas, that etches the silicon substrate surface only by an impact of ion without accompanying chemical reaction is used, as seeing from the result of SEM observation in the Example 9 described below, it is observed that the concave structure is formed under the pattern portion, although the border of concavo-convex structure is obviously unclear comparing with the sample in which the remaining films is removed by $CHF_3$ gas, oxygen gas. In view of the observation, it is assumed that the concave structure can be formed under the pattern portion due to the difference in etching resistance to alkaline etching liquid used in the Step (C) between the pattern itself and the silicon substrate.

The condition under which the irradiation of etching gas is carried out can be established by selecting suitably flow rate of gas, temperature, period, pressure so that the remaining film is removed by the irradiation of etching gas and the silicon substrate surface other than the pattern portion are exposed while remaining the pattern portion. For example, in case that the alkoxysilanes represented by the general formula (1)-(3) are used in the composition described in Example 1 described below and the thickness of remaining film other than the pattern portion is 50 nm, 3 minutes or more of etching gas irradiation time is required to remove the remaining film by irradiating $CHF_3$ gas under the condition of dry etching described in Examples. The time necessary for etching gas irradiation is a time that is required to remove the remaining film by irradiating the etching gas or more and can be selected within a range of time during which the pattern portion does not disappear. In case that it is within a range of time during which the pattern portion does not disappear, a mask effect of depositing film can be expected and accordingly the etching gas irradiation may be carried out for longer time than the time which is required to remove the remaining film.

Whether or not the remaining film has been removed can easily be confirmed by observation with scanning electron microscope (SEM). The expression, "the remaining film has been removed", means that the presence of remaining film on silicon substrate is not observed by SEM.

Step (C) for Forming Concave Structure Under Pattern by Processing Silicon Substrate Irradiated with Etching Gas with Alkaline Etching Liquid As the alkaline etching liquid, an alkaline etching liquid that is generally used for forming the texture structure of silicon substrate for solar cell can be used without any limitation. There can be exemplified aqueous solution of alkali metal hydroxide such as sodium hydroxide, potassium hydroxide, etc., aqueous cesium hydroxide solution, aqueous hydrazine solution, aqueous carbonate solution, aqueous sodium silicate solution, aqueous tetrabutylammonium hydroxide solution, etc. Considering that an anisotropic etching is carried out by utilizing a difference of etching rate in (100) plane, (110) plane, (111) plane of crystal plane orientation of silicon, especially, aqueous solution of alkali metal hydroxide such as sodium hydroxide, potassium hydroxide, etc. is preferably used because of its dissolving behavior such as dissolution rate and uniformly dissolving property in solubility according to the crystal lattice of silicon. The alkaline etching liquid may comprise as an additive surfactant, hydrochloride, sulfate, carboxylate, isopropyl alcohol, butyl alcohol, polyvinyl alcohol, etc.

Since etching of silicon substrate with alkaline etching liquid progresses continuously, the conditions for forming concave structure under pattern portion such as temperature, time can suitably be selected. Generally, the condition for the process with alkaline etching liquid can suitably be selected according to kind, concentration of the used alkaline etching liquid. The temperature can usually be selected from a range of 20-90° C., preferably 40-80° C., more preferably 50-80° C. and the process time can usually be selected form a range of 5-120 min, preferably 5-60 min, more preferably 5-30 min.

After the concave structure is formed under the pattern by the process with alkaline etching liquid, the residue deriving from the resin-comprising composition remains on the silicon substrate. However, during the process with alkaline etching liquid, the residue is separated from the silicon substrate and it stands on the silicon substrate having the concave structure. Accordingly, it can easily be removed by a rinsing treatment. In relation to condition for the rinsing treatment, there is no particular limitation on rinsing agent, and besides the agent solutions listed above as the alkaline etching liquid, water, organic solvent such as alcohol, acetone, etc. can be used.

As method for rinsing treatment, usual method such as dipping, flowing liquid cleaning, ultrasonic cleaning, etc. can be used. There is no particular limitation on temperature condition and treatment time, and the rinsing treatment can be carried out at a temperature of 0-50° C. and the process time is selected within a range of 1 sec-10 min.

Use of Silicon Substrate Having Texture Structure

The silicon substrate having texture structure formed by the method of the present invention may be used as silicon substrate for solar cell or LED light emitter, or mold for nanoimprint.

EXAMPLE

Now, the present invention will be described in more detail by way of examples, but the present invention is not limited to these examples.

Irradiation of Etching Gas

Using a reactive ion etching apparatus, the dry etching with oxygen gas, $CHF_3$ gas, Ar gas is carried out under the condition described below. The dry etching rate (nm/min) is previously calculated from the relationship between the etching time under the condition and the coating film-reducing amount of various photo-cured films.

As the dry etching condition for removing the remaining film formed by imprint, the minimum etching time necessary for removal of remaining film is calculated on the basis of a thickness of remaining film that is determined by SEM observation of cross section of imprinted pattern and the previously calculated dry etching rate of various photo-cured film, and the dry etching is carried out under the time condition that is not shorter than the minimum etching time.

Figure 2:
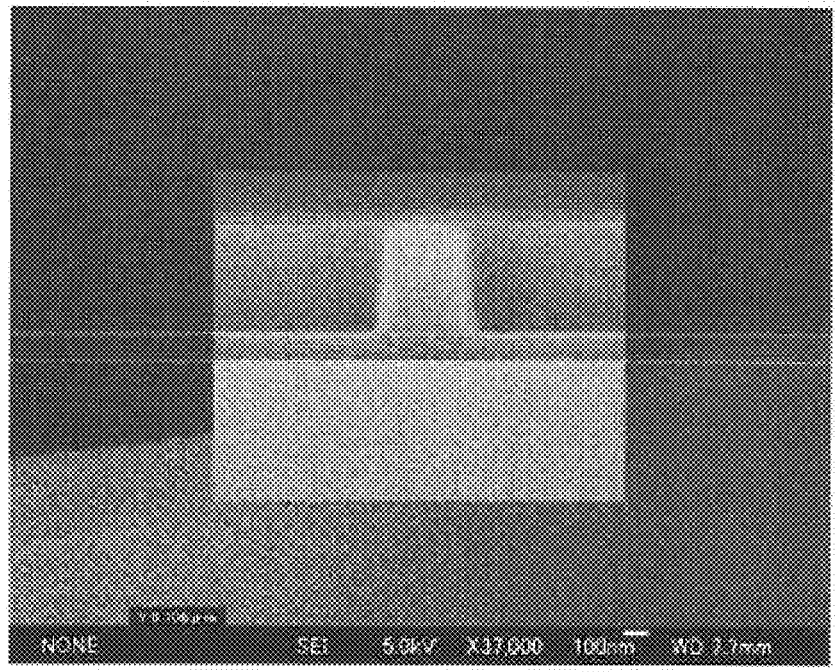
FIG. 2 is a photograph by electron microscopy observation, which shows a sectional fine structure of the silicon substrate before dry etching with $CHF_3$ gas (Step B).
Figure 3:
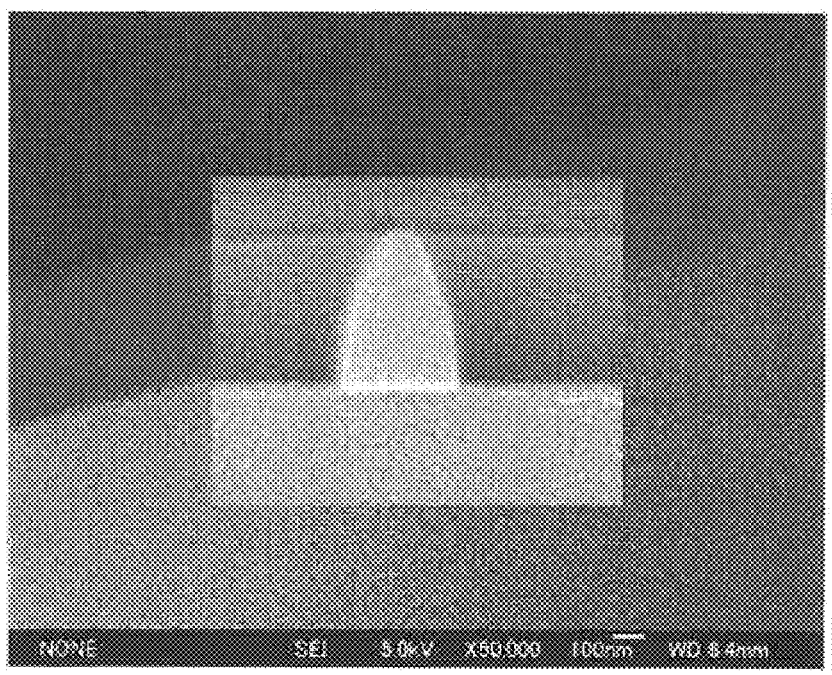
FIG. 3 is a photograph by electron microscopy observation, which shows a sectional fine structure of the silicon substrate after dry etching with $CHF_3$ gas (Step B).

By way of example, SEM photographs (cross section) of silicon substrate before and after the dry etching with $CHF_3$ gas are illustrated in FIG. 2 (cross-section) and FIG. 3 (cross-section), respectively.

Condition of Dry Etching

Oxygen gas: gas flow 50 sccm, PF power 100 W, controlled pressure 5.0 Pa $CHF_3$ gas: gas flow 50 sccm, PF power 100 W, controlled pressure 2.0 Pa Ar gas: gas flow 50 sccm, PF power 100 W, controlled pressure 2.0 Pa Example 1

Preparation of Resin-Comprising Composition 13.6 g of ethanol, 3.0 g of trimethoxysilylpropyl acrylate as the (meth)acrylic group-containing alkoxysilane, 6.8 g of ethyl silicate 40 (COLCOAT CO., LTD.; on average, pentamer of tetraethoxysilane) as the general alkoxysilane and 1.7 g of 85 wt. % zirconium butoxide (tetrabutyl zirconium alkoxide) in 1-butanol were blended. To the resulting mixture, an aqueous 2N—HCl/ethanol mixed solution which consists of 4.25 g of ethanol, 0.85 g of water and 0.16 g of 2N—HCl was gradually added in drops at room temperature with stirring. Moreover, aqueous ethanol solution which consists of 1 g of ethanol and 0.46 g of water was added gradually in drops and the resulting mixture was stirred at room temperature for one hour to obtain a hydrolysate (c) of mixture of the general alkoxysilane, the (meth)acrylic group-containing alkoxysilane, and the metal akloxide.

As the polymerizable monomer having (meth)acrylic group (a), 2.5 g of polyethylene glycol diacrylate (SHIN-NAKAMURA CHEMICAL CO., LTD.; NK ESTER A-200), 7.5 g of ethoxylated bisphenol A diacrylate (SHIN-NAKAMURA CHEMICAL CO., LTD.; NK ESTER A-BPE-10), 5.0 g of phenoxypolyethylene glycol acrylate (SHIN-NAKAMURA CHEMICAL CO., LTD.; NK ESTER AMP-10G), 5.0 g of hydroxyethylated o-phenylphenol acrylate (SHIN-NAKAMURA CHEMICAL CO., LTD.; NK ESTER A-LEN-10), and 5.0 g of tricyclodecanedimethanol diacrylate (SHIN-NAKAMURA CHEMICAL CO., LTD.; NK ESTER A-DCP) were used.

As the photoinitiator (b), 1.0 g of 2-dimethylamino-2-(4-methyl-benzyl)-1-(4-molpholin-4-yl-phenyl)-butan-1-one (BASF JAPAN LTD.; IRGACURE® 379 EG) was used.

As the polymerization inhibitor, 0.0375 g of hydroquinone monomethyl ether and 0.005 g of butylhydroxytoluene were used.

The polymerizable monomer having (meth)acrylic group (a), the photoinitiator (b) and the polymerization inhibitor were homogeneously blended to prepare a mixture and 4 g was weighed from the resulting mixture. To 4 g of the mixture, 14.2 g of the prepared hydrolysate (c) was added and the resulting mixture was stirred at room temperature for 15 minutes to obtain the resin-comprising composition.

Transcription and Photo-Curing of Pattern (Step (A))

Figure 4:
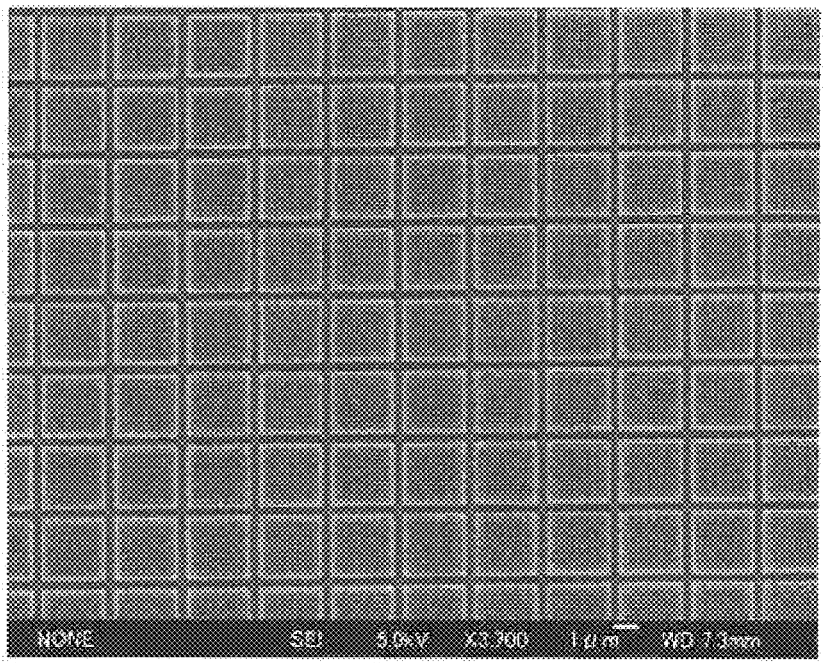
FIG. 4 is a photograph by electron microscopy observation, which shows surface fine structure of the pattern formed by nanoimprint described in Example 1.

The obtained resin-comprising composition was diluted with 1-methoxy-2-propanol to prepare a 20% by mass solution. The diluted resin-comprising composition was applied on a silicon wafer (P-type, one mirror-finished surface, no oxidized membrane) by spin-coating at 1000 rpm for 30 seconds and then dried at 110° C. for 2 minutes. Thus, the silicon wafer having a coating film of the resin-comprising composition was obtained. The silicon wafer was subjected to photo-nanoimprint in a photo-nanoimprint apparatus by using a quartz mold having lattice pattern of 300 nm of line (convex) width, 3 µm of pitch, 350 nm of height, applying 1 MPa of pressure on the mold and irradiating light from a LED 365 nm light source for 60 seconds. The nanoimprint pattern formed on the silicon wafer was observed with SEM and the SEM photograph was shown in FIG. 4 (surface).

Dry Etching (Step (B))

Thus obtained nanoimprint pattern was subjected to the dry etching with $CHF_3$ gas for 5 minutes to remove the remaining film.

A sample having a nanoimprint pattern formed under the same condition was observed with SEM to confirm that the remaining was removed.

Alkaline Etching Process and Rinsing Treatment (Step (C))

Figure 5:
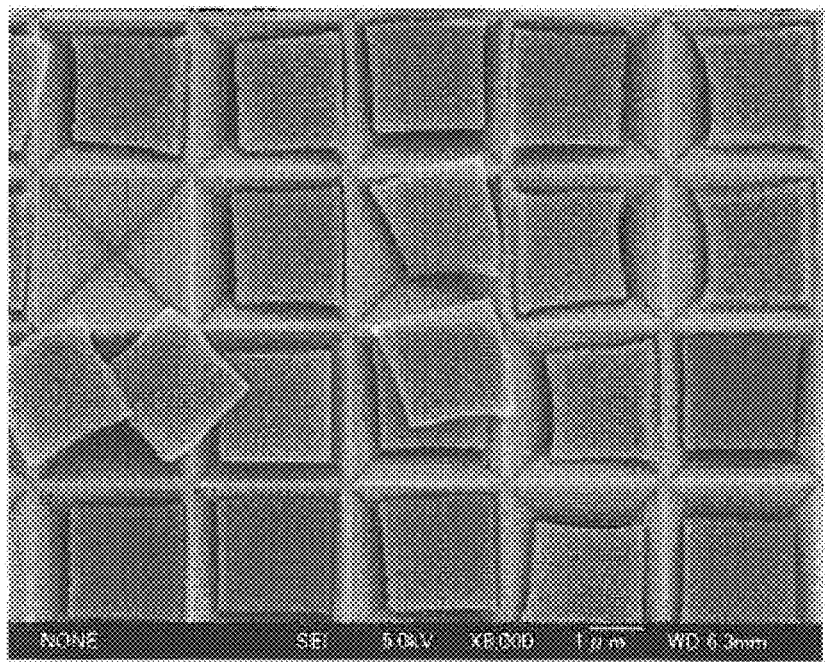
FIG. 5 is a photograph by electron microscopy observation, which shows surface fine structure of the silicon substrate, before the rinsing treatment, which is manufactured by the method of the present invention in Example 1.
Figure 6:
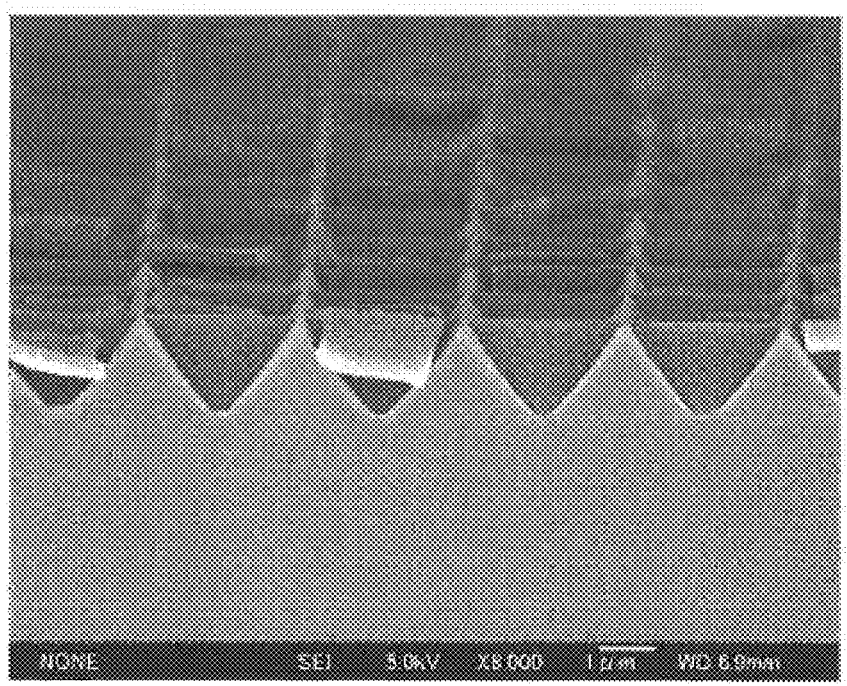
FIG. 6 is a photograph by electron microscopy observation, which shows sectional fine structure of the silicon substrate, before the rinsing treatment, which is manufactured by the method of the present invention in Example 1.
Figure 7:
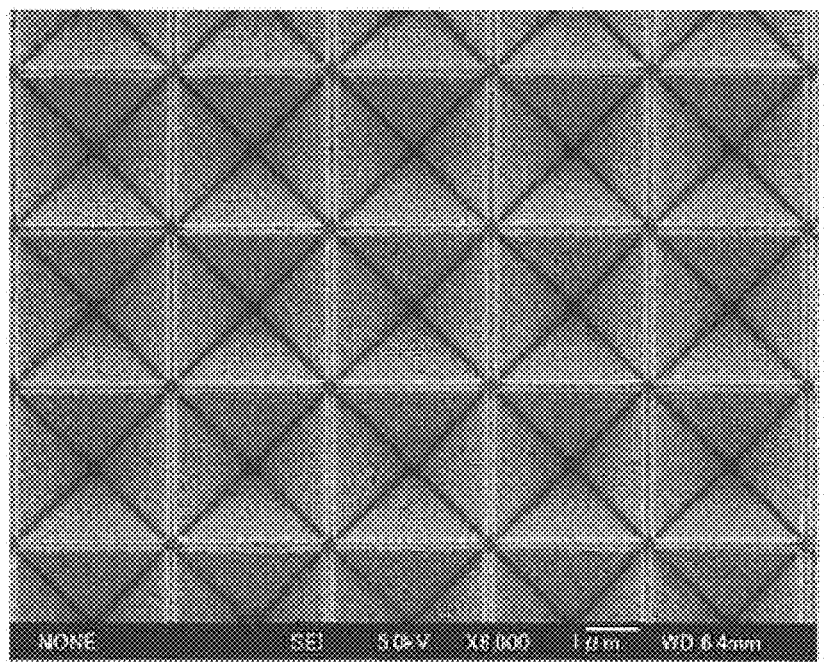
FIG. 7 is a photograph by electron microscopy observation, which shows surface fine structure of the silicon substrate, after the rinsing treatment, which is manufactured by the method of the present invention in Example 1.
Figure 8:
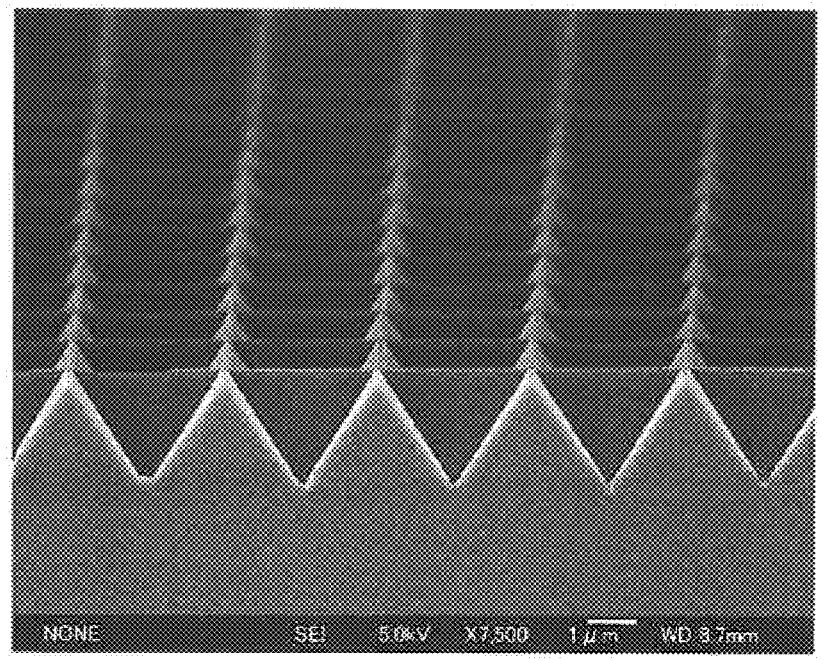
FIG. 8 is a photograph by electron microscopy observation, which shows sectional fine structure of the silicon substrate, after the rinsing treatment, which is manufactured by the method of the present invention in Example 1.

The sample in which the remaining film was removed by the dry etching with $CHF_3$ gas was dipped in an aqueous solution of sodium hydroxide 5%/isopropyl alcohol 3% and subjected to the alkaline etching process at 55° C. for 20 minutes. Thereafter, the sample was subjected to rinsing treatment by ultrasonic treating in 2.5% aqueous sodium hydroxide solution for 2 minutes and then in water for 1 minute. The SEM photographs of sample before rinsing treatment were shown in FIG. 5 (surface) and FIG. 6 (cross-section) and the SEM photographs after rinsing treatment are shown in FIG. 7 (surface) and FIG. 8 (cross-section).

It was seen from the SEM photograph before the rinse treatment that the concave structure was formed under the nanoimprint pattern portion by the alkaline etching process. It was also confirmed that after removing the pattern residue by the rinsing treatment, the silicon substrate having the inverted pyramid structure having about 3 µm of one side was manufactured as a silicon substrate having texture structure. It is considered that, in case of texture structure for wafer of solar cell, it is advantageous to improvement of power generation efficiency of solar cell for a space between the opening portions to have a fine structure as shown in FIG. 7.

Example 2

Operating in the same manner as Example 1, the preparation of resin-comprising composition and the transcription and photo-curing of pattern were conducted.

The obtained nanoimprint pattern was subjected to the dry etching with oxygen gas for 8 minutes to remove the remaining film.

A sample having nanoimprint pattern formed under the same condition was observed with SEM to confirm that the remaining was removed.

Figure 9:
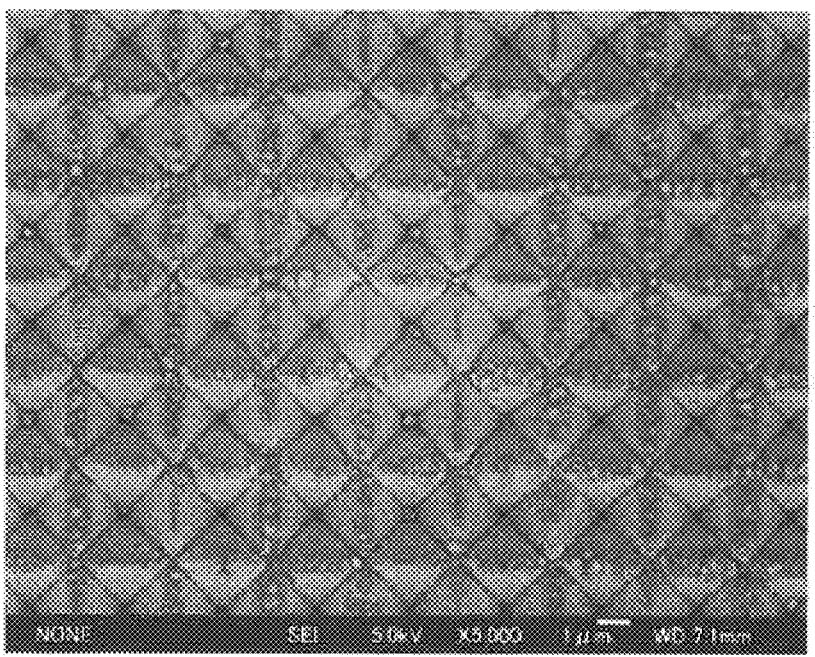
FIG. 9 is a photograph by electron microscopy observation, which shows surface fine structure of the silicon substrate, after the rinsing treatment, which is manufactured by the method of the present invention in Example 2.

Then, operating in the same manner as Example 1, the alkaline etching process and the rinsing treatment were conducted. The SEM photograph after the rinse treatment is shown in FIG. 9 (surface). It was also confirmed that the silicon substrate having the inverted pyramid structure having about 3 μm of one side was manufactured as a silicon substrate having texture structure.

Example 3

13.6 g of ethanol, 3.0 g of trimethoxysilylpropyl acrylate as the (meth)acrylic group-containing alkoxysilane, and 6.8 g of ethyl silicate 40 (COLCOAT CO., LTD.; on average, pentamer of tetraethoxysilane) as the general alkoxysilane were blended. To the resulting mixture, an aqueous 2N—HCl/ethanol mixed solution which consists of 4.25 g of ethanol, 0.85 g of water and 0.16 g of 2N—HCl was gradually added in drops at room temperature with stirring. Moreover, aqueous ethanol solution which consists of 1 g of ethanol and 0.32 g of water was added gradually in drops and the resulting mixture was stirred at room temperature for one hour to obtain a hydrolysate (c) of mixture of the general alkoxysilane and the (meth)acrylic group-containing alkoxysilane.

Operating in the same manner as Example 1, the polymerizable monomer having (meth)acrylic group (a), the photoinitiator (b), the polymerization inhibitor were homogeneously blended to prepare a mixture and 4 g was weighed from the resulting mixture.

To 4 g of the mixture, 13.4 g of the prepared partial hydrolysate (c) was added and the resulting mixture was stirred at room temperature for 15 minutes to obtain the resin-comprising composition.

Figure 10:
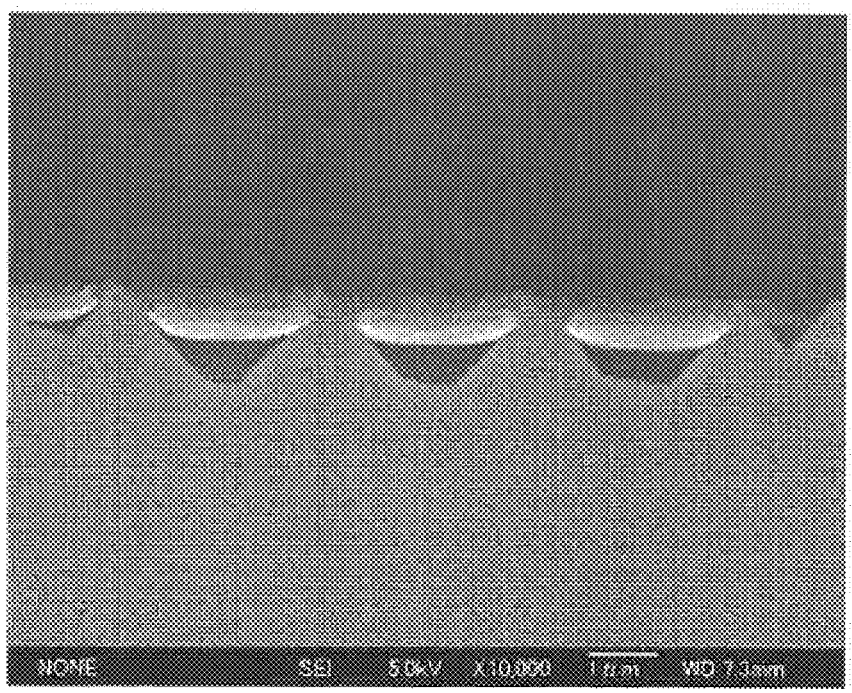
FIG. 10 is a photograph by electron microscopy observation, which shows sectional fine structure of the silicon substrate, before the rinsing treatment, which is manufactured by the method of the present invention in Example 3.
Figure 11:
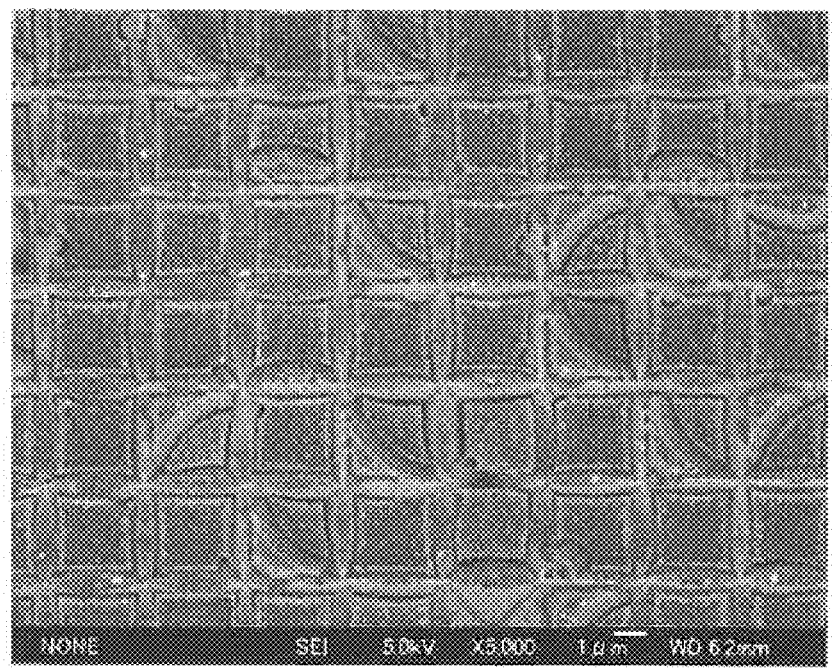
FIG. 11 is a photograph by electron microscopy observation, which shows surface fine structure of the silicon substrate, before the rinsing treatment, which is manufactured by the method of the present invention in Example 3.

Except the preparation of resin-comprising composition described above, the other operations, that is, the transcription and photo-curing of pattern, the dry etching, the alkaline etching process and the rinsing treatment were conducted similarly to Example 1. The SEM photographs before the rinsing treatment were shown in FIG. 10 (cross-section) and FIG. 11 (surface). Though the silicon substrate having the inverted pyramid structure having about 3 μm of one side was manufactured as a silicon substrate having texture structure, the space between opening portions of the inverted pyramid structure was slightly enlarged in comparison with Example 1.

Example 4

Operating in the same manner as Example 1, the preparation of resin-comprising composition, the transcription and photo-curing of pattern, and the dry etching were conducted.

Figure 12:
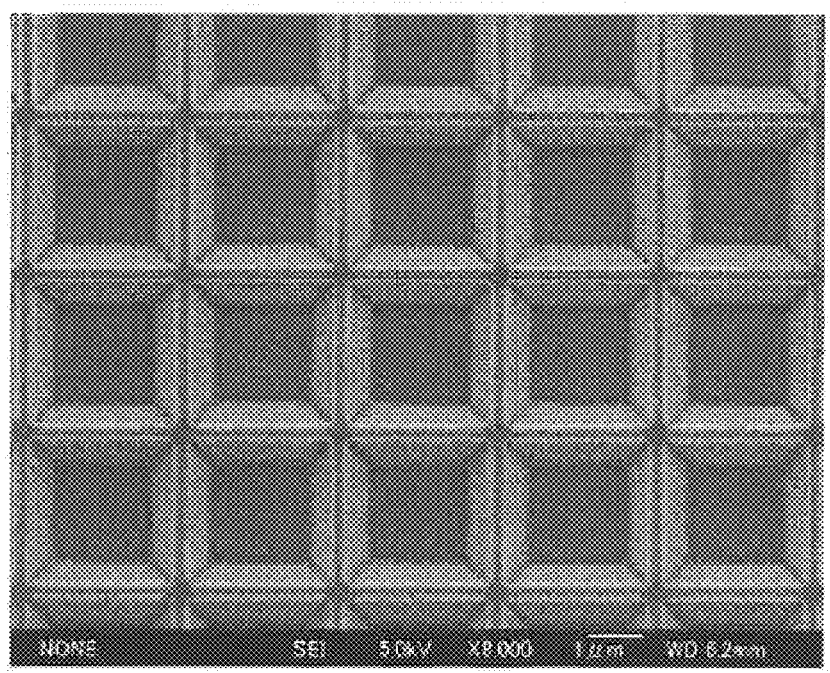
FIG. 12 is a photograph by electron microscopy observation, which shows surface fine structure of the silicon substrate, after the rinsing treatment, which is manufactured by the method of the present invention in Example 4.
Figure 13:
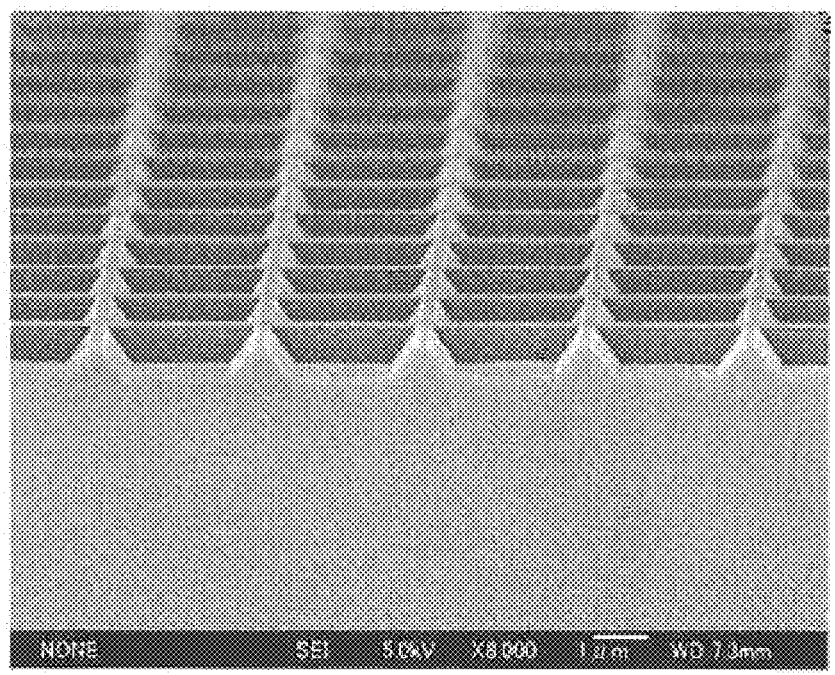
FIG. 13 is a photograph by electron microscopy observation, which shows sectional fine structure of the silicon substrate, after the rinsing treatment, which is manufactured by the method of the present invention in Example 4.

The sample in which the remaining film was removed by the dry etching with $CHF_3$ gas was dipped in an aqueous solution of sodium hydroxide 5%/isopropyl alcohol 3% and subjected to the alkaline etching process at 55° C. for 10 minutes. Thereafter, the sample was subjected to the rinsing treatment by ultrasonic treating in 2.5% aqueous sodium hydroxide solution for 2 minutes and then in water for 1 minute. The SEM photographs of sample after the rinsing treatment were shown in FIG. 12 (surface) and FIG. 13 (cross-section). It was also confirmed that the silicon substrate having the concave structure in the shape of trapezoid having the opening portion of about 3 μm was manufactured as a silicon substrate having texture structure.

Example 5

As the (meth)acrylic group-having polymerizable monomer (a), 2.5 g of polyethylene glycol diacrylate (SHIN-NAKAMURA CHEMICAL CO., LTD.; NK ESTER A-200), 7.5 g of ethoxylated bisphenol A diacrylate (SHIN-NAKAMURA CHEMICAL CO., LTD.; NK ESTER A-BPE-10), 5.0 g of phenoxypolyethylene glycol acrylate (SHIN-NAKAMURA CHEMICAL CO., LTD.; NK ESTER AMP-10G), 5.0 g of hydroxyethylated o-phenylphenol acrylate (SHIN-NAKAMURA CHEMICAL CO., LTD.; NK ESTER A-LEN-10), and 5.0 g of tricyclodecanedimethanol diacrylate (SHIN-NAKAMURA CHEMICAL CO., LTD.; NK ESTER A-DCP) were used.

As the photoinitiator (b), 1.0 g of 2-dimethylamino-2-(4-methyl-benzyl)-1-(4-molpholin-4-yl-phenyl)-butan-1-one (BASF JAPAN LTD.; IRGACURE® 379 EG) was used.

As the polymerization inhibitor, 0.0375 g of hydroquinone monomethyl ether and 0.005 g of butylhydroxytoluene were used.

The (meth)acrylic group-having polymerizable monomer (a), the photoinitiator (b) and the polymerization inhibitor were homogeneously blended to prepare a resin-comprising composition.

The obtained resin-comprising composition was diluted with 1-methoxy-2-propanol to prepare a 30% by mass solution. The diluted resin-comprising composition was applied on a silicon (100) wafer (P-type, one mirror-finished surface, no oxidized membrane) by spin-coating at 2000 rpm for 30 seconds to obtain the silicon wafer having a coating film of the resin-comprising composition. The resin-comprising composition was photo-cured by irradiating light from a LED 365 nm light source at a pressure of 0 MPa for 60 seconds while maintaining a mold made of polydimethyl siloxane having a lattice pattern of 300 nm of line (convex) width, 3 μm of pitch, 350 nm of height on the silicon wafer. The mold made of polydimethyl siloxane was removed and then the photo-cured pattern was dried 110° C. for 2 minutes.

Thus obtained nanoimprint pattern was subjected to the dry etching with $CHF_3$ gas for 5 minutes to remove the remaining film.

A sample having a nanoimprint pattern formed under the same condition was observed with SEM to confirm that the remaining was removed.

The sample in which the remaining film was removed by the dry etching with $CHF_3$ gas was dipped in an aqueous solution of sodium hydroxide 5%/isopropyl alcohol 3% and subjected to the alkaline etching process at 55° C. for 20 minutes. Thereafter, the sample was subjected to the rinsing treatment by ultrasonic treating in 2.5% aqueous sodium hydroxide solution for 2 minutes and then in water for 1 minute. As the result of SEM observation, it was confirmed that the silicon substrate having the inverted pyramid structure having about 3 μm of one side was manufactured as a silicon substrate having texture structure. Comparing with Example 1, when the resin-comprising composition comprises no silicon compound (c), the time of alkaline etching process which is required to manufacture the silicon substrate having the inverted pyramid structure having about 3 μm of one side was 3 times longer.

Example 6

As the polymerizable monomer, 2.5 g of polyethylene glycol diacrylate (SHIN-NAKAMURA CHEMICAL CO., LTD.; NK ESTER A-200), 5.0 g of tricyclodecanedimethanol diacrylate (SHIN-NAKAMURA CHEMICAL CO., LTD.; NK ESTER A-DCP), 7.5 g of 2-hydroxy-3-acryloylpropyl acrylate (SHIN-NAKAMURA CHEMICAL CO., LTD.; NK ESTER 701A) (as (meth)acrylic group-containing polymerizable monomer (a)), and 10.0 g of phthalic acid mono[2-acryloyloxyethyl]ester (KYOEISHA CHEMICAL CO., LTD.; LIGHT ACRYLATE HOA-MPL (N)) (as acidic group-containing polymerizable monomer having (meth)) acrylate group (a')) were used.

As the photoinitiator (b), 1.0 g of 2-dimethylamino-2-(4-methyl-benzyl)-1-(4-molpholin-4-yl-phenyl)-butan-1-one (BASF JAPAN LTD.; IRGACURE® 379 EG) was used.

As the polymerization inhibitor, 0.0375 g of hydroquinone monomethyl ether and 0.005 g of butylhydroxytoluene were used.

The (meth)acrylic group-having polymerizable monomer (a), the (meth)acrylic group-containing polymerizable monomer having carboxylic group (a'), the photoinitiator (b) and the polymerization inhibitor were homogeneously blended to prepare a resin-comprising composition.

The obtained resin-comprising composition was diluted with 1-methoxy-2-propanol to prepare a 30% by mass solution. The diluted resin-comprising composition was applied on a silicon (100) wafer (P-type, one mirror-finished surface, no oxidized membrane) by spin-coating at 2000 rpm for 30 seconds to obtain the silicon wafer having a coating film of the resin-comprising composition. The resin-comprising composition was photo-cured by irradiating light from a LED 365 nm light source at a pressure of 0 MPa for 60 seconds while maintaining a mold made of polydimethyl siloxane having a lattice pattern of 300 nm of line (convex) width, 3 μm of pitch, 350 nm of height on the silicon wafer. The mold made of polydimethyl siloxane was removed and then the photo-cured pattern was dried at 110° C. for 2 minutes.

Thus obtained nanoimprint pattern was subjected to the dry etching with CHF$_3$ gas for 5 minutes to remove the remaining film.

A sample having a nanoimprint pattern formed under the same condition was observed with SEM to confirm that the remaining was removed.

Figure 14:
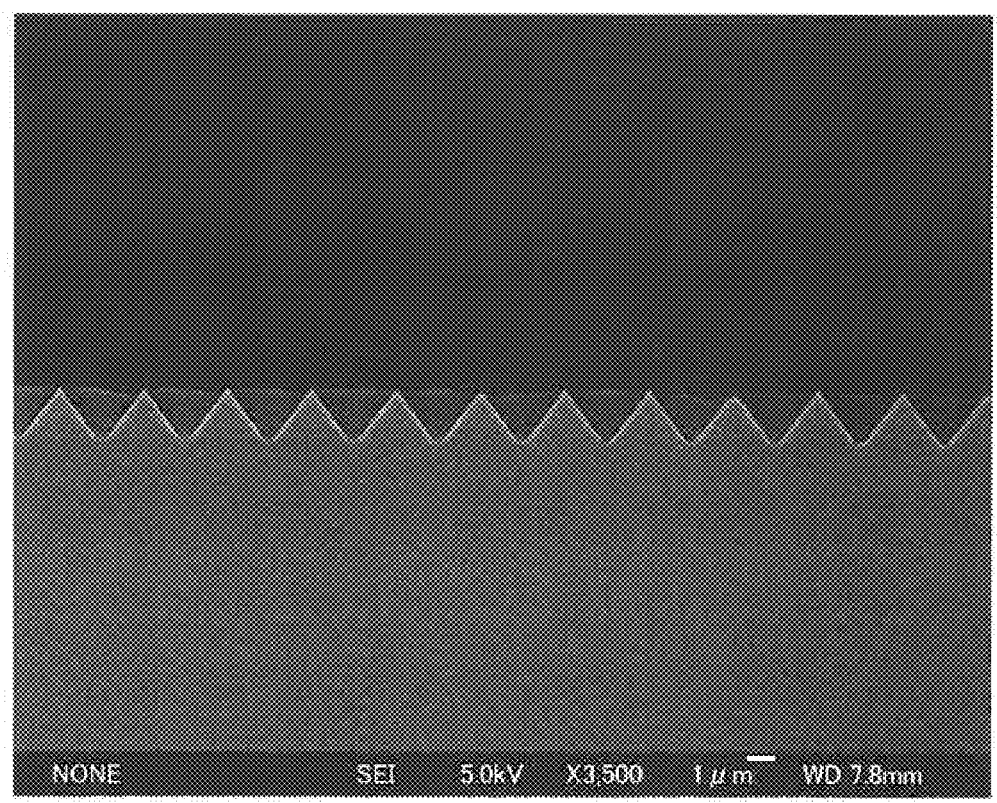
FIG. 14 is a photograph by electron microscopy observation, which shows sectional fine structure of the silicon substrate, after the rinsing treatment, which is manufactured by the method of the present invention in Example 6.

The sample in which the remaining film was removed by the dry etching with CHF$_3$ gas was dipped in an aqueous solution of sodium hydroxide 5%/isopropyl alcohol 3% and subjected to the alkaline etching treatment at 55° C. for 20 minutes. Thereafter, the sample was subjected to a rinse treatment by ultrasonic treating in 2.5% aqueous sodium hydroxide solution for 2 minutes and then in water for 1 minute. The SEM photograph of the sample after the rinse treatment was shown in FIG. 14 (cross-section). It was confirmed that the silicon substrate having the inverted pyramid structure having about 3 μm of one side was manufactured as a silicon substrate having texture structure. Comparing with Example 5, the time of alkaline etching process which is required to manufacture the silicon substrate having the inverted pyramid structure having about 3 μm of one side was shorted to ½.

Example 7

4.4 g of ethanol and 3.0 g of trimethoxysilylpropyl acrylate as the (meth)acrylic group-containing alkoxysilane were blended to prepared a solution of silicon compound (c) in ethanol.

As the (meth)acrylic group-having polymerizable monomer (a), 2.5 g of polyoethylene glycol diacrylate (SHIN-NAKAMURA CHEMICAL CO., LTD.; NK ESTER A-200), 7.5 g of ethoxylated bisphenol A diacrylate (SHIN-NAKAMURA CHEMICAL CO., LTD.; NK ESTER A-BPE-10), 5.0 g of phenoxypolyethylene glycol acrylate (SHIN-NAKAMURA CHEMICAL CO., LTD.; NK ESTER AMP-10G), 5.0 g of hydroxyethylated o-phenylphenol acrylate (SHIN-NAKAMURA CHEMICAL CO., LTD.; NK ESTER A-LEN-10), and 5.0 g of tricyclodecanedimethanol diacrylate (SHIN-NAKAMURA CHEMICAL CO., LTD.; NK ESTER A-DCP) were used.

As the photoinitiator (b), 1.0 g of 2-dimethylamino-2-(4-methyl-benzyl)-1-(4-molpholin-4-yl-phenyl)-butan-1-one (BASF JAPAN LTD.; IRGACURE® 379 EG) was used.

As the polymerization inhibitor, 0.0375 g of hydroquinone monomethyl ether and 0.005 g of butylhydroxytoluene were used.

The (meth)acrylic group-having polymerizable monomer (a), the photoinitiator (b) and the polymerization inhibitor were homogeneously blended to prepare a mixture and 1 g was weighed from the resulting mixture. To 1 g of the mixture, 4.1 g of the prepared solution of silicon compound (c) in ethanol was added and the resulting mixture was stirred at room temperature for 15 minutes to obtain the resin-comprising composition.

Operating in the same manner as Example 1, the transcription and photo-curing of pattern and the dry etching were conducted.

Figure 15:
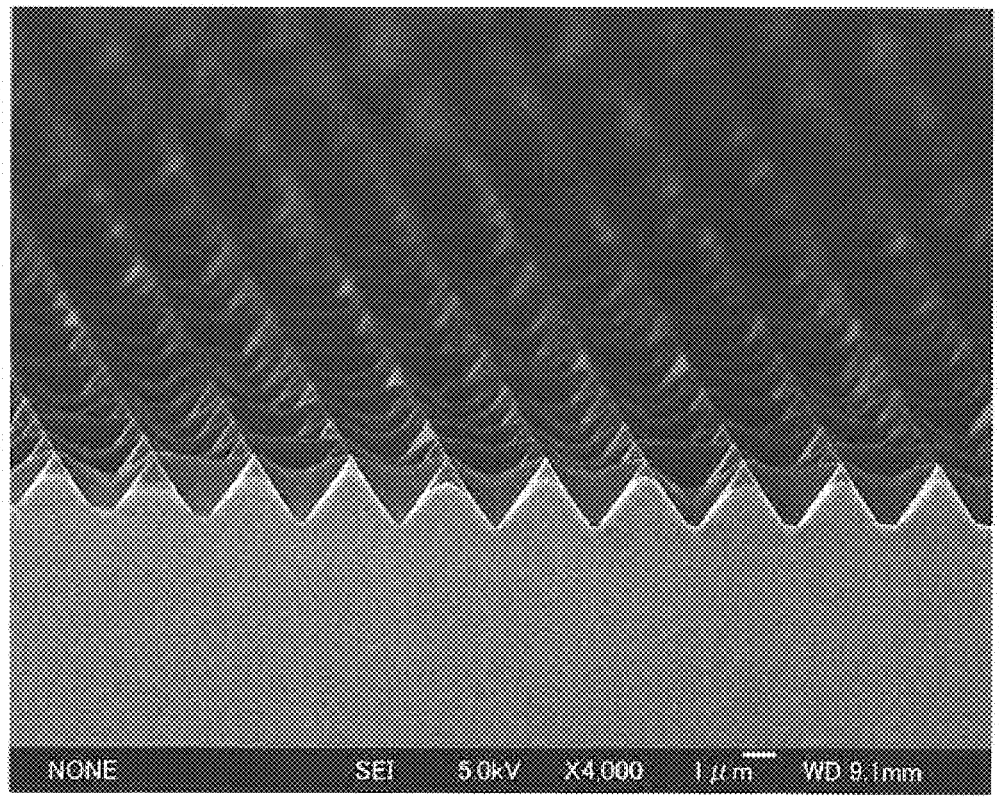
FIG. 15 is a photograph by electron microscopy observation, which shows sectional fine structure of the silicon substrate, after the rinsing treatment, which is manufactured by the method of the present invention in Example 7.

The sample in which the remaining film was removed by the dry etching with CHF$_3$ gas was dipped in an aqueous solution of sodium hydroxide 5%/isopropyl alcohol 3% and subjected to the alkaline etching process at 55° C. for 20 minutes. Thereafter, the sample was subjected to a rinsing treatment by ultrasonic treating in 2.5% aqueous sodium hydroxide solution for 2 minutes and then in water for 1 minute. The SEM photograph of sample after the rinsing treatment was shown in FIG. 15 (cross-section). It was confirmed that the silicon substrate having the concave structure with opening portion of about 3 μm was manufactured as a silicon substrate having texture structure.

Example 8

Operating in the same manner as Example 1, the resin-comprising composition was prepared.

Figure 16:
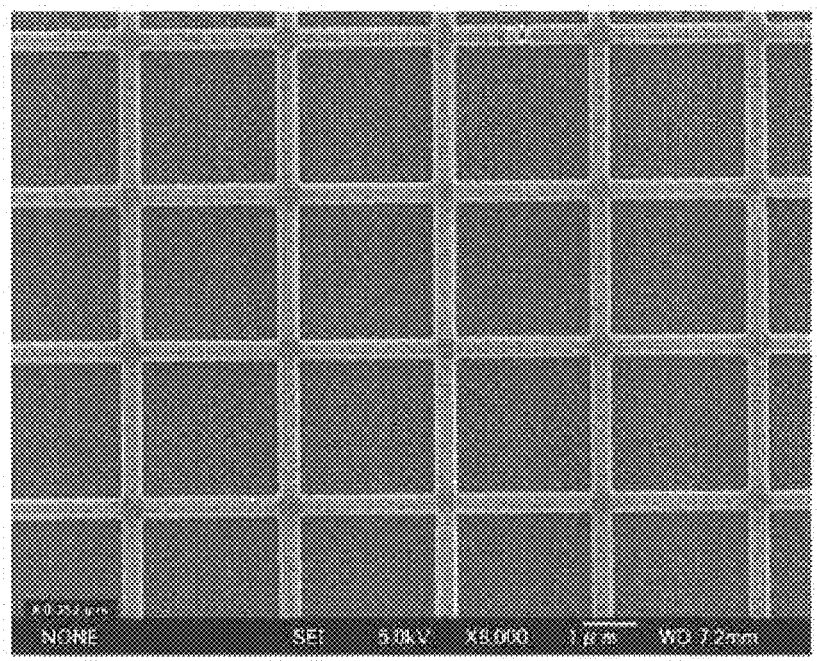
FIG. 16 is a photograph by electron microscopy observation, which shows surface fine structure of the pattern formed by nanoimprint described in Example 8.

The obtained resin-comprising composition was diluted with 1-methoxy-2-propanol to prepare a 20% by mass solution. The diluted resin-comprising composition was applied on a silicon (100) wafer (P-type, one mirror-finished surface, no oxidized membrane) by spin-coating at 2000 rpm for 30 seconds and the coating film was dried at 110° C. for 2 minutes to obtain the silicon wafer having a coating film of the resin-comprising composition. The silicon wafer was subjected to a photo-nanoimprint in a photo-nanoimprint apparatus by using a quartz mold having reciprocal lattice pattern of 300 nm of line (concave) width, 3 μm of pitch, 350 nm of height, applying 1 MPa of pressure and irradiating light from a LED 365 nm light source for 60 seconds. The formed nanoimprint pattern was observed with SEM and the SEM photograph was shown in FIG. 16 (surface).

Thus obtained nanoimprint pattern was subjected to the dry etching with CHF$_3$ gas for 8 minutes to remove the remaining film.

A sample having a nanoimprint pattern formed under the same condition was observed with SEM to confirm that the remaining was removed.

Figure 17:
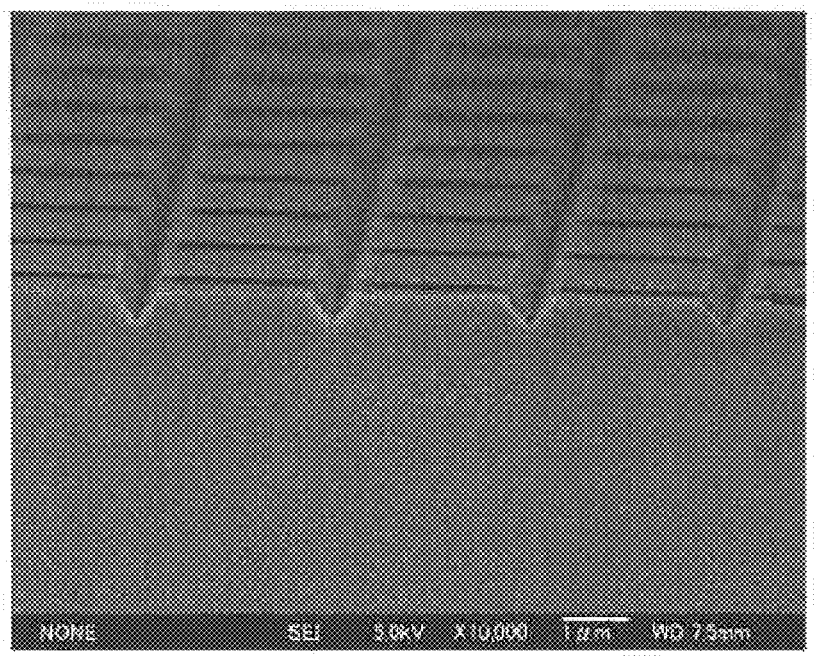
FIG. 17 is a photograph by electron microscopy observation, which shows sectional fine structure of the silicon substrate, after the rinsing treatment, which is manufactured by the method of the present invention in Example 8.

The sample in which the remaining film was removed by the dry etching with CHF$_3$ gas was dipped in an aqueous solution of sodium hydroxide 5%/isopropyl alcohol 3% and subjected to the alkaline etching process at 55° C. for 30 minutes. Thereafter, the sample was subjected to a rinsing treatment by ultrasonic treating in 2.5% aqueous sodium hydroxide solution for 2 minutes and then in water for 1 minute. The SEM photograph after the rinsing treatment was shown in FIG. 17 (cross-section).

As the result of SEM observation, it was seen that the concave structure was formed under the nanoimprint pattern portion by the alkaline etching process.

Example 9

Operating in the same manner as Example 1, the resin-comprising composition was prepared.

The obtained resin-comprising composition was diluted with 1-methoxy-2-propanol to prepare a 20% by mass solution. The diluted resin-comprising composition was applied on a silicon (100) wafer (P-type, one mirror-finished surface, no oxidized membrane) by spin-coating at 2000 rpm for 30 seconds and the coating film was dried at 110° C. for 2 minutes to obtain the silicon wafer having a coating film of the resin-comprising composition. The silicon wafer was subjected to a photo-nanoimprint in a photo-nanoimprint apparatus by using a quartz mold (NTT-AT NANOFALICATION CO. LTD., NIM-PH350: mixed lording of lines, dots and holes), applying 4 MPa of pressure and irradiating light from a LED 365 nm light source for 60 seconds.

Thus obtained nanoimprint pattern was subjected to the dry etching with $CHF_3$ gas for 14 minutes to remove the remaining film.

A sample having a nanoimprint pattern formed under the same condition was observed with SEM and it was confirmed that the remaining was removed.

The sample in which the remaining film was removed by the dry etching with $CHF_3$ gas was dipped in an aqueous solution of sodium hydroxide 5%/isopropyl alcohol 3% and subjected to the alkaline etching process at 55° C. for 20 minutes. Thereafter, the sample was subjected to a rinsing treatment by ultrasonic treating in 2.5% aqueous sodium hydroxide solution for 2 minutes and then in water for 1 minute. As the result of SEM observation of the sample after the rinsing treatment, it was seen that the silicon substrate having the formed prism structure as the silicon substrate having the concave structure formed under the line pattern portion by the alkaline etching treatment.

To 0.28 g of a solution having a solid content of 10% obtained by diluting (3,3,3-trifluoropropyl)trimethoxisilane as fluorinated silane compound that is an alkoxysilane having halogen atom with ethanol, 3.0 g of trimethoxysilyltrimethylene acrylate as the (meth)acrylic group-containing alkoxysilane and 13.6 g of ethanol, aqueous 2N—HCl/ethanol mixed solution which consists of 1.63 g of ethanol, 0.31 g of water and 0.06 g of 2N—HCl was gradually added in drops and the resulting mixture was stirred at room temperature for 1 hour to obtain a hydrolysate of mixture of the fluorinated silane compound and the (meth)acrylic group-containing alkoxysilane. To the obtained hydrolysate, 6.8 g of ethyl silicate 40 (COLCOAT CO., LTD.; on average, pentamer of tetraethoxysilane) as the general alkoxysilane and 1.7 g of 85% by mass zirconium butoxide (tetrabutyl zirconium alkoxide) (as the metal alkoxide) solution in 1-butanol were blended. To the resulting mixture, an aqueous 2N—HCl/ethanol mixed solution which consists of 2.62 g of ethanol, 0.66 g of water and 0.10 g of 2N—HCl was gradually added in drops at room temperature with stirring. Moreover, an aqueous ethanol solution which consists of 1.00 g of ethanol and 0.37 g of water was added gradually in drops and the resulting mixture was stirred at room temperature for one hour to obtain a hydrolysate (c) comprising further hydrolysate of alkoxysilane and hydrolysate of metal alkoxide.

Operating in the same manner as Example 1, the (meth) acrylic group-having polymerizable monomer (a), the photoinitiator (b) and the polymerization inhibitor were homogeneously blended and 4 g was weighed from the resulting mixture.

To 4 g of the mixture, 14.0 g of the obtained hydrolysate (c) was added and the resulting mixture was stirred at room temperature for 15 minutes to obtain a resin-comprising composition.

Except the preparation of resin-comprising composition described above, the other operations, that is, the transcription and photo-curing of pattern, the dry etching, the alkaline etching process and the rinsing treatment were conducted similarly to Example 1. As the result of SEM observation of the sample after the rinsing treatment, it was confirmed that the silicon substrate having the inverted pyramid structure having about 3 μm of one side was manufactured as a silicon substrate having texture structure.

Example 11

Operating in the same manner as Example 1, the preparation of resin-comprising composition and the transcription and photo-curing of pattern were conducted.

The obtained nanoimprint pattern was subjected to the dry etching with Ar gas for 4 minutes to remove the remaining film.

A sample having a nanoimprint pattern formed under the same condition was observed with SEM to confirm that the remaining was removed.

Figure 18:
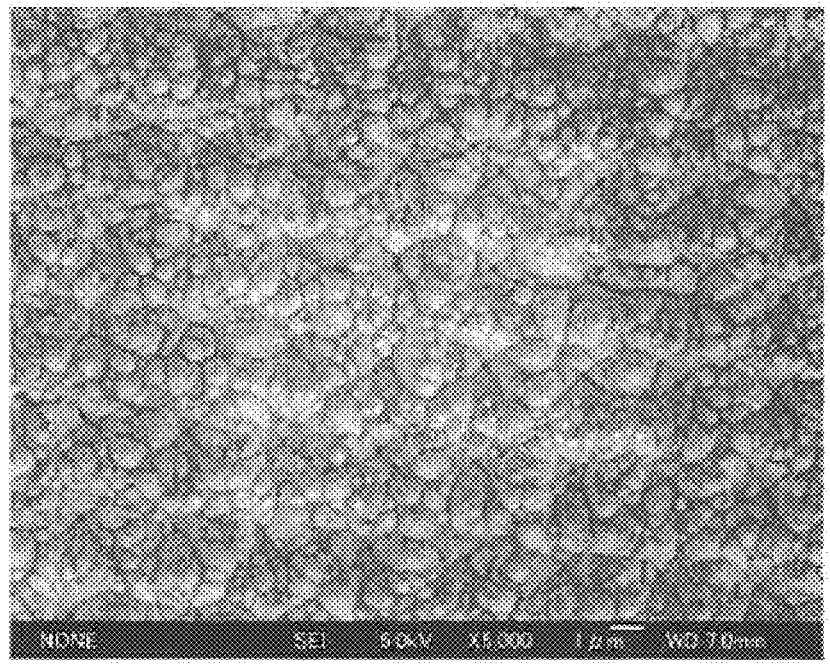
FIG. 18 is a photograph by electron microscopy observation, which shows surface fine structure of the silicon substrate, after the rinsing treatment, which is manufactured by the method of the present invention in Example 11.
Figure 19:
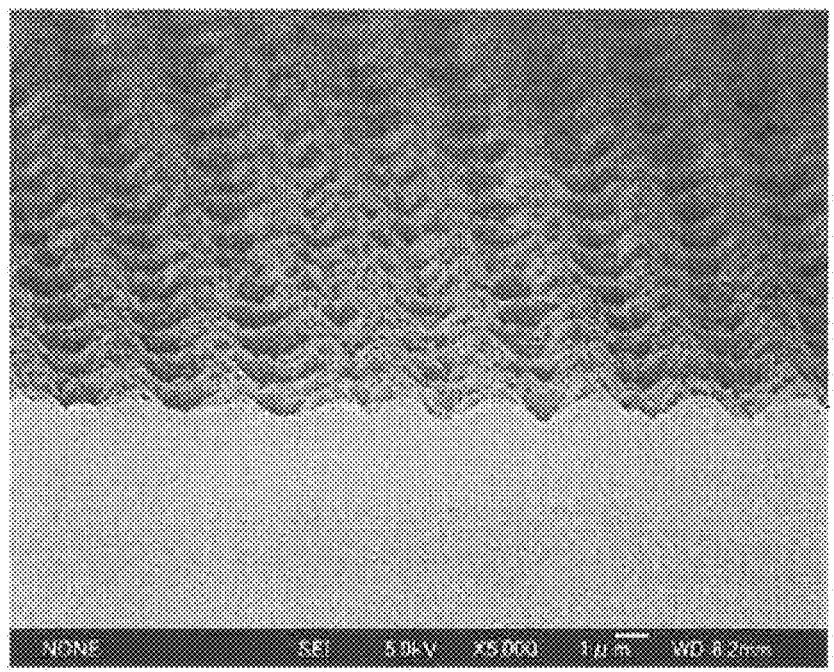
FIG. 19 is a photograph by electron microscopy observation, which shows sectional fine structure of the silicon substrate, after the rinsing treatment, which is manufactured by the method of the present invention in Example 11.

Then, operating in the same manner as Example 1, the alkaline etching process and the rinsing treatment were conducted. As the result of SEM observation of the sample after the rinsing treatment, it was seen that though the concave structure was formed under the pattern portion, the boundary of texture structure was obviously unclear in comparison with the sample in which the remaining film was removed by etching with $CHF_3$ gas or oxygen gas. The SEM photographs of the sample after the rinsing treatment were shown in FIG. 18 (surface) and FIG. 19 (cross-section.

Comparative Example 1

Figure 20:
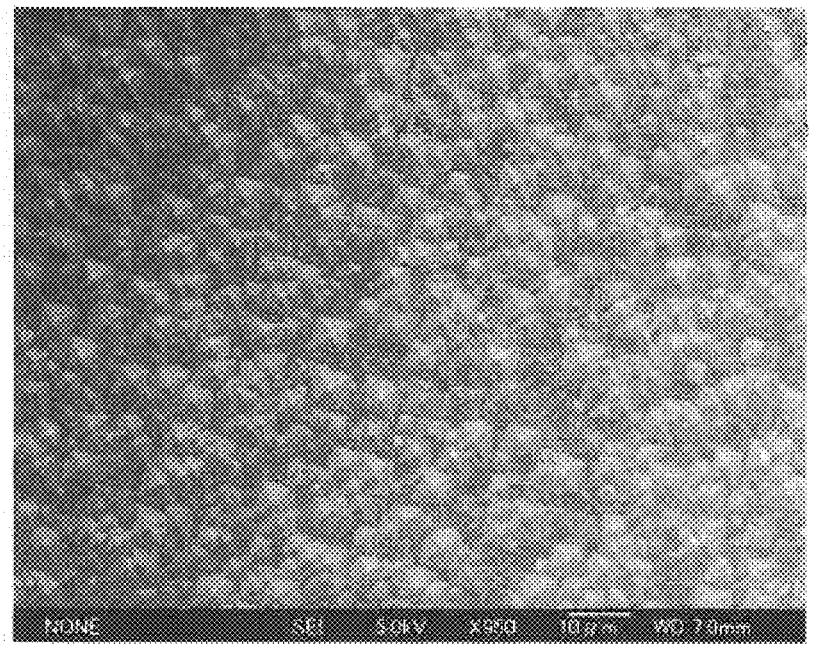
FIG. 20 is a photograph by electron microscopy observation, which shows surface fine structure of the silicon substrate, after the rinsing treatment, which is manufactured by the method of the present invention in Comparative Example 1.

Operating in the same manner as Example 1, the preparation of resin-comprising composition, the transcription and photo-curing of pattern, the alkaline etching process and the rinsing treatment were conducted but the removal of remaining film by dry etching in Example 1 was omitted. As the result of SEM observation of the sample after the rinsing treatment (see FIG. 20 (surface)), it was seen that the silicon substrate having the concave structure formed under the pattern portion was not manufactured.

Comparative Example 2

Operating in the same manner as Example 1, the preparation of resin-comprising composition, the transcription and photo-curing of pattern, the alkaline etching process and the rinsing treatment were conducted but the nanoimprint pattern was subjected the dry etching with $CHF_3$ gas for only 1 minute, whereby the remaining film was not removed completely (as the result of SEM observation, it was confirmed that the remaining film remained). As the result of SEM observation of the sample after the rinsing treatment (see FIG.

20 (surface)), it was seen that the silicon substrate having the concave structure formed under the pattern portion was not manufactured.

The invention claimed is:

1. A method for manufacturing a silicon substrate having texture structure, said method comprising steps of:
   (A) forming a pattern with a resin-comprising composition on the silicon substrate,
   (B) irradiating an etching gas to the silicon substrate surface other than the pattern portion, and
   (C) processing the silicon substrate irradiated with the etching gas with an alkaline etching liquid to form concave structure under the pattern portion,
   wherein said resin-comprising composition comprises:
      (a) polymerizable monomer having (meth)acrylic group,
      (b) photoinitiator, and
      (c) hydrolysate of akloxysilane,
   wherein said hydrolysate of alkoxysilane is at least one selected from a group consisting of:
      hydrolysate of a mixture of general alkoxysilane having a general formula (2):

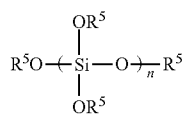

(2)

(wherein ($R^5$)s are, same or different, $C_{1-4}$ alkyl group; n is an integer of 1-10) and (meth)acrylic group-containing alkoxysilane having a general formula (3):

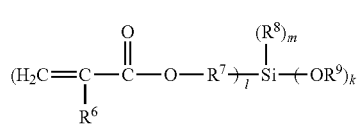

(3)

(wherein $R^6$ is hydrogen atom or methyl; $R^7$ is $C_{1-10}$ alkylene, $C_{3-10}$ cycloalkylene or $C_{3-10}$ polymethylene; $R^8$ is $C_{1-4}$ alkyl, $C_{3-4}$ cycloalkyl or $C_{6-12}$ aryl; $R^9$ is $C_{1-4}$ alkyl or $C_{3-4}$ cycloalkyl; l is an integer of 1-3, m is an integer of 0-2, k is an integer of 1-3 and (l+m+k) is 4; in case that respective $R^6$, $R^7$, $R^8$ or $R^9$ is present in plural, each of $R^6$(s), $R^7$(s), $R^8$(s) or $R^9$(s) may be same to or different from each other);
      hydrolysate of the (meth)acrylic group-containing alkoxysilane of the general formula (3); and
      hydrolysate of a mixture of the general alcoxysilane of the general formula (2), the (meth)acrylic group-containing alkoxysilane of the general formula (3) and metal alkoxide having a general formula (6):

M-(OR$^{13}$)$_4$ (6)

(wherein M is zirconium or titanium; and ($R^{13}$)s are, same or different, $C_{1-10}$ alkyl group).

2. The method according to claim 1, wherein said resin-comprising composition further comprises (a') acidic group-containing polymerizable monomer having (meth)acrylic group.

3. The method according to claim 1, wherein in the step (A), after forming a coating film by applying the resin-comprising composition on the silicon substrate, a pattern is formed on the substrate by transcribing the pattern to the coating film from a mold by photo-imprint.

4. The method according to claim 1, wherein the silicon substrate is a silicon substrate that is not subjected to a step of forming an oxide film.

5. The method according to claim 1, wherein the texture structure of the manufactured silicon substrate is a texture structure which is suitable for solar cell wafer or LED substrate.

6. The method according to claim 1, wherein in the step (B), the etching gas is a gas comprising at least fluorine-containing gas or oxygen-containing gas.

7. The method according to claim 1, wherein in the step (C), the alkaline etching liquid is an aqueous solution of alkali metal hydroxide/isopropanol.

8. The method according to claim 1, comprising further a step of rinsing the silicon substrate having texture structure prepared in the step (C) with an alkali to remove residue of pattern.

9. A silicon substrate having texture structure, manufactured by the method according to claim 1.

10. The silicon substrate according to claim 9, wherein the silicon substrate having texture structure is a silicon substrate for solar cell or LED light emitter, or a mold for nanoimprint.

11. A composition comprising photo-curable resin usable as the resin-comprising composition in the method according to claim 1, said composition comprising photo-curable resin comprising:
   (a) polymerizable monomer having (meth)acrylic group,
   (b) photoinitiator, and
   (c) hydrolysate of alkoxysilane,
   wherein said hydrolysate of alkoxysilane is at least one selected from a group consisting of:
      hydrolysate of a mixture of general alkoxysilane having a general formula (2):

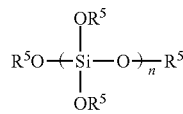

(2)

(wherein ($R^5$)s are, same or different, $C_{1-4}$ alkyl group; n is an integer of 1-10) and (meth)acrylic group-containing alkoxysilane having a general formula (3):

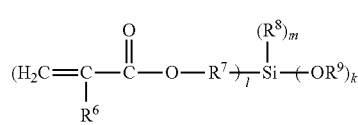

(3)

(wherein $R^6$ is hydrogen atom or methyl; $R^7$ is $C_{1-10}$ alkylene, $C_{3-10}$ cycloalkylene or $C_{3-10}$ polymethylene; $R^8$ is $C_{1-4}$ alkyl, $C_{3-4}$ cycloalkyl or $C_{6-12}$ aryl; $R^9$ is $C_{1-4}$ alkyl or $C_{3-4}$ cycloalkyl; l is an integer of 1-3, m is an integer of 0-2, k is an integer of 1-3 and (l+m+k) is 4; in case that respective $R^6$, $R^7$, $R^8$ or $R^9$ is present in plural, each of $R^6$(s), $R^7$(s), $R^8$(s) or $R^9$(s) may be same to or different from each other);
      hydrolysate of the (meth)acrylic group-containing alkoxysilane of the general formula (3); and
      hydrolysate of a mixture of the general alcoxysilane of the general formula (2), the (meth)acrylic group-containing alkoxysilane of the general formula (3) and metal alkoxide having a general formula (6):

$$M\text{-}(OR^{13})_4 \qquad (6)$$

(wherein M is zirconium or titanium; and $(R^{13})$s are, same or different, $C_{1-10}$ alkyl group).

12. The composition according to claim 11, wherein said composition further comprises (a') acidic group-containing polymerizable monomer having (meth)acrylic group.

* * * * *